United States Patent
Ebata et al.

(10) Patent No.: US 8,785,927 B2
(45) Date of Patent: Jul. 22, 2014

(54) LAMINATE STRUCTURE INCLUDING OXIDE SEMICONDUCTOR THIN FILM LAYER, AND THIN FILM TRANSISTOR

(75) Inventors: Kazuaki Ebata, Sodegaura (JP); Shigekazu Tomai, Sodegaura (JP); Yuki Tsuruma, Sodegaura (JP); Shigeo Matsuzaki, Sodegaura (JP); Koki Yano, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/881,032

(22) PCT Filed: Dec. 27, 2011

(86) PCT No.: PCT/JP2011/007307
§ 371 (c)(1),
(2), (4) Date: Apr. 23, 2013

(87) PCT Pub. No.: WO2012/090490
PCT Pub. Date: Jul. 5, 2012

(65) Prior Publication Data
US 2013/0221351 A1   Aug. 29, 2013

(30) Foreign Application Priority Data

Dec. 28, 2010 (JP) ................................ 2010-293799
Apr. 5, 2011 (JP) ................................ 2011-083768
May 10, 2011 (JP) ................................ 2011-105718
Nov. 17, 2011 (JP) ................................ 2011-251792

(51) Int. Cl.
*H01L 29/12* (2006.01)

(52) U.S. Cl.
USPC ................................................. 257/43

(58) Field of Classification Search
USPC ............. 257/43, E29.296, E29.273; 438/104, 438/149, 150
See application file for complete search history.

(56) References Cited

U.S. PATENT DOCUMENTS

| | | | |
|---|---|---|---|
| 6,238,808 B1 | 5/2001 | Arao et al. | |
| 6,383,359 B2 * | 5/2002 | Arao et al. | 205/155 |
| 7,087,831 B2 * | 8/2006 | Den et al. | 136/250 |
| 8,207,014 B2 * | 6/2012 | Sasaki et al. | 438/104 |
| 8,384,077 B2 | 2/2013 | Yano et al. | |
| 2007/0126361 A1 * | 6/2007 | Lee | 313/586 |
| 2009/0269880 A1 | 10/2009 | Itagaki et al. | |

(Continued)

FOREIGN PATENT DOCUMENTS

| | | |
|---|---|---|
| JP | 2000-22189 A | 1/2000 |
| JP | 2003-86808 | 3/2003 |

(Continued)

OTHER PUBLICATIONS

Chen et al., "Surface potential study of amorphous In-Ga-Zn-O thin film transistors." Journal of Applied Physics, 108 (2010): pp. 114508-1 to 114508-5.*

(Continued)

*Primary Examiner* — Michele Fan
(74) *Attorney, Agent, or Firm* — Foley & Lardner LLP

(57) ABSTRACT

A stacked layer structure including an oxide layer and an insulating layer, the oxide layer having a carrier concentration of $10^{18}/cm^3$ or less and an average crystal diameter of 1 μm or more; and the crystals of the oxide layer being arranged in a columnar shape on the surface of the insulating layer.

6 Claims, 9 Drawing Sheets

(56) References Cited

U.S. PATENT DOCUMENTS

| | | | |
|---|---|---|---|
| 2010/0043859 A1* | 2/2010 | Aranami et al. | 136/244 |
| 2010/0051938 A1 | 3/2010 | Hayashi et al. | |
| 2010/0065835 A1 | 3/2010 | Inoue et al. | |
| 2010/0117071 A1* | 5/2010 | Inoue et al. | 257/43 |
| 2010/0117078 A1* | 5/2010 | Kuwabara et al. | 257/43 |
| 2010/0127266 A1 | 5/2010 | Saito et al. | |
| 2010/0133529 A1 | 6/2010 | Taraschi et al. | |
| 2010/0133530 A1* | 6/2010 | Akimoto et al. | 257/43 |
| 2010/0140609 A1* | 6/2010 | Yano et al. | 257/43 |
| 2010/0163867 A1* | 7/2010 | Yamazaki et al. | 257/43 |
| 2010/0213459 A1* | 8/2010 | Shimada et al. | 257/43 |
| 2010/0289020 A1 | 11/2010 | Yano et al. | |
| 2010/0301329 A1* | 12/2010 | Asano et al. | 257/43 |
| 2010/0302492 A1* | 12/2010 | Kubota et al. | 349/138 |
| 2011/0006297 A1* | 1/2011 | Inoue et al. | 257/43 |
| 2011/0006301 A1* | 1/2011 | Yamazaki et al. | 257/43 |
| 2011/0053322 A1* | 3/2011 | Sasaki et al. | 438/149 |
| 2011/0084261 A1 | 4/2011 | Sekiya et al. | |
| 2011/0175081 A1 | 7/2011 | Goyal et al. | |
| 2011/0198602 A1 | 8/2011 | Nanbu et al. | |
| 2011/0260121 A1 | 10/2011 | Yano et al. | |
| 2012/0024383 A1 | 2/2012 | Kaiho et al. | |
| 2012/0058600 A1* | 3/2012 | Kuwabara et al. | 438/104 |
| 2012/0132911 A1 | 5/2012 | Shimada et al. | |
| 2013/0112971 A1 | 5/2013 | Yano et al. | |
| 2013/0146452 A1 | 6/2013 | Yano et al. | |

FOREIGN PATENT DOCUMENTS

| | | |
|---|---|---|
| JP | 2004-137547 A | 5/2004 |
| JP | 2004-273614 A | 9/2004 |
| JP | 2005-290550 | 10/2005 |
| JP | 2008-130814 A | 6/2008 |
| JP | WO 2008-096768 A1 | 8/2008 |
| JP | 2009-99944 | 5/2009 |
| JP | 2009-170494 | 7/2009 |
| JP | 2009-206508 | 9/2009 |
| JP | 2010-80936 A | 4/2010 |
| JP | 2010-093051 | 4/2010 |
| JP | 2010-114226 | 5/2010 |
| JP | 2010-123748 | 6/2010 |
| KR | 10-2010-0094509 A | 8/2010 |
| KR | 2010-0094509 | 8/2010 |
| TW | 201005938 A1 | 2/2010 |
| TW | 201006022 A1 | 2/2010 |
| TW | 201044668 | 12/2010 |
| TW | 201135913 A1 | 10/2011 |
| TW | 201138105 A1 | 11/2011 |
| WO | WO 2009/075161 A1 | 6/2009 |
| WO | WO-2010/033910 | 3/2010 |
| WO | WO-2010/067571 A1 | 6/2010 |

OTHER PUBLICATIONS

International Search Report PCT/JP2011/007307 dated Apr. 3, 2012.
Office Action Korean Application No. 2012-074466343 dated Dec. 6, 2012.
Office Action Japanese Patent Application No. 2013-011205 dated Feb. 20, 2013.
Office Action Japanese Patent Application No. 2013-025941 dated Mar. 21, 2013.
Extended European Search Report received in European Patent Application No. 118532221.7 dated Jan. 17, 2014.
Office Action received in Taiwan Patent Application No. 102129390 dated Nov. 14, 2013.
Office Action dated Sep. 17, 2013 received in Taiwan Application No. 100149319.
Office Action received in Chinese Patent Application No. 201180037647.6 dated Mar. 18, 2014.
Office Action received in Chinese Patent Application No. 201310258582.9 dated Apr. 22, 2014.

* cited by examiner

MISORIENTATION: 2° OR MORE AND LESS THAN 5°   MISORIENTATION: 5° OR MORE AND LESS THAN 15°   MISORIENTATION: 15° OR MORE AND LESS THAN 180°

IMMEDIATELY AFTER DEPOSITION

AFTER ANNEALING

LAMINATE STRUCTURE INCLUDING OXIDE SEMICONDUCTOR THIN FILM LAYER, AND THIN FILM TRANSISTOR

TECHNICAL FIELD

The invention relates to a stacked layer structure that includes an oxide semiconductor thin film layer, and a thin film transistor that utilizes the oxide semiconductor thin film layer as a channel layer.

BACKGROUND ART

A field effect transistor has been widely used as a unit electronic device of a semiconductor memory integrated circuit, a high-frequency signal amplifier device, a liquid crystal drive device, and the like. The field effect transistor is an electronic device that is most widely put to practical use at present.

In recent years, development of displays (display apparatuses) has rapidly progressed, and a thin film transistor (TFT) has been widely used for a display (e.g., liquid crystal display (LCD), electroluminescence (EL) display, or field emission display (FED)) as a switching device for applying a drive voltage to the display element.

A transparent semiconductor thin film formed of a metal oxide (particularly zinc oxide crystals) that exhibits excellent stability as compared with a silicon-based semiconductor thin film has attracted attention in recent years.

For example, Patent Documents 1 and 2 disclose a method that crystallizes zinc oxide at a high temperature to form a thin film transistor. Patent Document 3 states that a thin film transistor that exhibits high mobility was obtained by patterning an amorphous oxide film, and crystallizing the patterned amorphous oxide film.

Patent Document 4 discloses a thin film transistor that utilizes $In_2O_3$, and states that it is desirable that indium oxide be amorphous before performing a heat treatment, and be crystalline after performing the heat treatment. However, the thin film transistor disclosed in Patent Document 4 that utilizes $In_2O_3$ crystals as the channel layer has normally-on properties, and an increase in carrier concentration and a decrease in mobility may occur due to the crystallization step.

RELATED-ART DOCUMENT

Patent Document

Patent Document 1: JP-A-2003-86808
Patent Document 2: JP-A-2004-273614
Patent Document 3: WO2008/096768
Patent Document 4: JP-A-2008-130814

SUMMARY OF THE INVENTION

An object of the invention is to provide a high-quality oxide thin film that has a controlled crystal orientation and crystal diameter (grain size). Another object of the invention is to significantly improve TFT characteristics by utilizing the oxide thin film as a channel layer of a TFT.

The inventors of the invention found that a crystalline semiconductor thin film obtained by forming a homogeneous amorphous oxide thin film, and annealing the amorphous thin film has a uniform crystal orientation and crystal diameter. The inventors also found that TFT characteristics (e.g., field-effect mobility and S-factor) are significantly improved by utilizing such a crystalline oxide semiconductor thin film as a channel layer of a thin film transistor.

1. A stacked layer structure comprising an oxide layer and an insulating layer,
    the oxide layer having a carrier concentration of $10^{18}/cm^3$ or less and an average crystal diameter of 1 μm or more; and
    the crystals of the oxide layer being arranged in a columnar shape on the surface of the insulating layer.
2. The stacked layer structure according to 1, wherein a material constituting the oxide layer is selected from indium oxide, Ga-doped indium oxide, Al-doped indium oxide, Zn-doped indium oxide and Sn-doped indium oxide.
3. The stacked layer structure according to 2, wherein the Ga-doped indium oxide has an atomic ratio Ga/(Ga+In) of 0.01 to 0.09.
4. The stacked layer structure according to 2, wherein the Al-doped indium oxide has an atomic ratio Al/(Al+In) of 0.01 to 0.05.
5. A method for producing a stacked layer structure comprising an oxide layer and an insulating layer comprising the steps of:
    (1) preparing an insulating layer;
    (2) forming on the insulating layer an oxide thin film such that Rrms (root-mean-square-roughness) in a 20×20 μm² area becomes 1.0 to 5.3 Å; and
    (3) subjecting the oxide thin film to heat treatment at 150 to 500° C.
6. The method for producing a stacked layer structure according to 5, wherein the oxide layer is formed in an atmosphere of a mixed gas containing rare gas atoms and one or more molecules selected from water molecules, oxygen molecules and nitrous oxide molecules.
7. The method for producing a stacked layer structure according to 6, wherein the oxide layer is formed in an atmosphere of a mixed gas containing rare gas and at least water.
8. The method for producing a stacked layer structure according to 7, wherein the water is contained in the atmosphere at a partial pressure ratio of 0.1% to 25%.
9. The method for producing a stacked layer structure according to any of 5 to 8, wherein the oxide layer comprises a material selected from indium oxide, Ga-doped indium oxide, Al-doped indium oxide, Zn-doped indium oxide and Sn-doped indium oxide.
10. The method for producing a stacked layer structure according to 9, wherein the Ga-doped indium oxide has an atomic ratio Ga/(Ga+In) of 0.01 to 0.09.
11. The method for producing a stacked layer structure according to 9, wherein the Al-doped indium oxide has an atomic ratio Al/(Al+In) of 0.01 to 0.05.
12. The method for producing a stacked layer structure according to any of 5 to 11, wherein the oxide layer formation in the step (2) is conducted by a sputtering method in which substrates are sequentially carried at positions opposing to three or more targets arranged in parallel in a vacuum chamber with a predetermined distance being provided therebetween, and when a negative potential and a positive potential are alternately applied to each of the targets from alternating power sources, at least one of outputs from the alternating power sources is applied to two or more targets that are connected in a branched mariner while switching the targets, whereby plasma is caused to be generated on the targets.
13. The method for producing a stacked layer structure according to 12, wherein the alternating current density of the alternating power source is 3 W/cm² or more and 20 W/cm² or less.

14. The method for producing a stacked layer structure according to 12 or 13, wherein the frequency of the alternating power source is 10 kHz to 1 MHz.
15. A stacked layer structure produced by the method according to any of 5 to 14.
16. A thin film transistor comprising:
the oxide layer and the insulating layer in the stacked layer structure according to any of 1 to 4 and 15 as a channel layer and a gate insulating film respectively; and
a protecting film which comprises SiNx being provided on the oxide layer.
17. A display apparatus comprising the thin film transistor according to 16.

According to the invention, a TFT that exhibits improved field-effect mobility and a good S-factor can be formed with high reproducibility by utilizing the oxide thin film having a controlled crystal orientation and crystal diameter as the channel layer.

DESCRIPTION OF EMBODIMENTS

Figure 1:
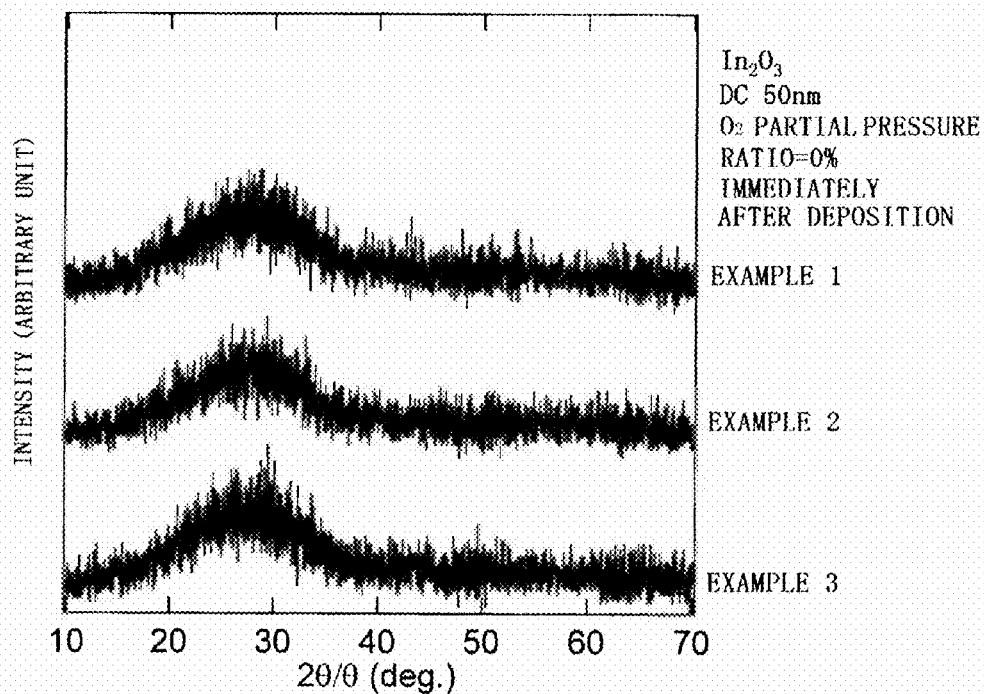
FIG. 1 shows the X-ray diffraction chart of a thin film formed on a glass substrate (immediately after deposition) (Examples 1 to 3).

Exemplary embodiments of a stacked layer structure that includes an oxide layer and an insulating layer, a method for producing the stacked layer structure, a thin film transistor that utilizes the oxide layer as a channel layer, and a display apparatus according to the invention are described in detail below. Note that the invention is not limited to the following exemplary embodiments and examples.

The stacked layer structure according to the invention includes an oxide layer and an insulating layer, the oxide layer having a carrier concentration of $10^{18}/cm^3$ or less and an average crystal diameter of 1 μm or more, and the crystals of the oxide layer being arranged in a columnar shape on the surface of the insulating layer.

The oxide layer included in the stacked layer structure according to the invention is a crystalline oxide semiconductor thin film (hereinafter may be referred to as "crystalline semiconductor thin film" or "crystalline oxide thin film") that is obtained by forming an amorphous oxide thin film (hereinafter may be referred to as "amorphous thin film") on the insulating layer while controlling the amorphous structure of the thin film immediately after formation by controlling the forming conditions, and annealing the amorphous oxide thin film to effect crystallization.

The term "amorphous" used herein in connection with a thin film means that a halo pattern is observed (i.e., the crystal structure cannot be specified) when subjecting the thin film to X-ray crystal structure analysis.

The crystalline oxide semiconductor thin film included in the stacked layer structure according to the invention has a grain-subgrain structure. The crystal grains of the crystalline oxide semiconductor thin film having an average crystal diameter of 1 μm or more are referred to as "grains", and the crystals of the crystalline oxide semiconductor thin film that are arranged in a columnar shape on the surface of the insulating layer are referred to as "subgrains".

It is preferable that a material constituting the oxide layer be selected from indium oxide, Ga-doped indium oxide, Al-doped indium oxide, Zn-doped indium oxide, and Sn-doped indium oxide. Note that the oxide layer may include unavoidable impurities as long as the oxide layer mainly includes the above elements.

When indium oxide is doped with Ga or Al, the degree of 5 s orbital overlap of In increases due to a decrease in lattice constant, so that the mobility of the thin film is expected to increase.

If the atomic ratio Ga/(Ga+In) of gallium metal and indium metal exceeds 0.09, the crystallization temperature of the Ga-doped indium oxide thin film may increase, so that crystallization after annealing may be insufficient when water is introduced during sputtering. If the atomic ratio Ga/(Ga+In) is less than 0.01, a decrease in lattice constant due to Ga doping may be suppressed, so that the effects of Ga doping may not be sufficiently achieved.

Therefore, the atomic ratio Ga/(Ga+In) of gallium metal and indium metal in the Ga-doped indium oxide thin film is preferably 0.01 to 0.09, more preferably 0.02 to 0.085, and still more preferably 0.05 to 0.08, when introducing water when forming the thin film.

If the atomic ratio Al/(Al+In) of aluminum metal and indium metal exceeds 0.05, Al may not be dissolved in the In site, and may precipitate at the crystal grain boundaries or the like. If the atomic ratio Al/(Al+In) is less than 0.01, a decrease in lattice constant due to Al doping may be suppressed, so that the effects of Al doping may not be sufficiently achieved.

Therefore, the atomic ratio Al/(Al+In) of aluminum metal and indium metal in the oxide layer according to the invention is preferably 0.01 to 0.05, more preferably 0.01 to 0.04, and still more preferably 0.01 to 0.03.

The atomic ratio Zn/(Zn+In) in Zn-doped indium oxide is preferably 0.01 to 0.09, and more preferably 0.01 to 0.07. If the atomic ratio Zn/(Zn+In) of indium metal and zinc metal in the Zn-doped indium oxide thin film exceeds 0.09, Zn may not be dissolved in the In site, and may precipitate at the crystal grain boundaries or the like.

The atomic ratio Sn/(Sn+In) in Sn-doped indium oxide is preferably 0.001 to 0.05, and more preferably 0.002 to 0.02. If the atomic ratio Sn/(Sn+In) of tin metal and indium metal in the Sn-doped indium oxide thin film exceeds 0.05, Sn dissolved in In may serve as a donor, so that a semiconductor may not be obtained due to an increase in carrier concentration.

A material used to form the insulating layer included in the stacked layer structure according to the invention is not particularly limited. A known material may be arbitrarily selected as the material used to form the insulating layer. For example, compounds such as $SiO_2$, $SiN_x$, $Al_2O_3$, $Ta_2O_6$, $TiO_2$, $MgO$, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTi_3$, $BaTa_2O_6$, $SrTiO_3$, $Sm_2O_3$, and AlN may be used to form the insulating layer. Among these, $SiO_2$, $SiN_x$, $Al_2O_3$, $Y_2O_3$, $HfO_2$, and $CaHfO_3$ are preferable, and $SiO_2$, $SiN_x$, $Y_2O_3$, $HfO_2$, and $CaHfO_3$ are more preferable.

Note that the number of oxygen atoms of these oxides need not necessarily coincide with the stoichiometric ratio (e.g., $SiO_2$ or $SiO_x$ may be used).

The insulating layer may have a structure in which two or more insulating films formed of different material are stacked. The insulating film that forms the insulating layer may be crystalline, polycrystalline, or amorphous. It is preferable that the insulating film be polycrystalline or amorphous from the viewpoint of ease of industrial production.

The carrier concentration in the oxide layer is $10^{18}/cm^3$ or less, preferably $10^{13}$ to $10^{18}/cm^3$, more preferably $10^{14}$ to $10^{18}/cm^3$, and particularly preferably $10^{15}$ to $10^{18}/cm^3$. If the carrier concentration in the oxide layer exceeds $10^{18}/cm^3$, a leakage current may occur when forming a thin film transistor or the like. Moreover, the thin film transistor may not exhibit excellent transistor performance due to normally-on properties or a decrease in on/off ratio. If the carrier concentration in the oxide layer is less than $10^{13}/cm^3$, the thin film transistor may not be driven due to a decrease in number of carriers.

The carrier concentration in the oxide layer may be measured by a Hall effect measurement method, The details of the carrier concentration measurement method are described in the examples.

The average crystal diameter of the oxide crystal particles of the oxide layer (i.e., the oxide semiconductor thin film that forms the oxide layer) is 1 μm or more, preferably 1 to 27 μm, more preferably 1.3 to 27 μm, and particularly preferably 2.1 to 27 μm. If the average crystal diameter of the oxide layer is less than 1 μm, microcrystals may have been formed in the thin film when forming the thin film. If the average crystal diameter of the oxide layer exceeds 27 μm, a variation in TFT characteristics may occur due to scattering of carriers at the crystal grain boundaries.

The average crystal diameter of the oxide layer (i.e., the oxide semiconductor thin film that forms the oxide layer) is measured using an electron backscattering pattern (EBSP) (described later). More specifically, EBSP orientation mapping is performed, and the average crystal diameter is analyzed using an area enclosed by components having a misorientation of 15° or more as a crystal grain. The details of the average crystal diameter measurement method are described in the examples.

Note that the average crystal diameter of the oxide layer may be determined by measuring the maximum diameter of each crystal grain observed within a 35×35-μm square area using scanning ion microscopy (SIM) or a scanning electron microscope (SEM), and calculating the average value of the maximum diameters. In this case, a result similar to that obtained using the EBSP can also be obtained.

SIM is a technique that visualizes secondary electrons discharged when scanning the sample with focused ion beams as a signal. When using SIM, composition contrast and crystal orientation contrast strongly appear as compared with an SEM image. Since the interaction between ions and the sample is large as compared with electrons, the surface information strongly appears.

It is necessary that the crystals of the oxide layer (i.e., the oxide semiconductor thin film that forms the oxide layer) be arranged in a columnar shape on the surface of the insulating layer. The expression "the crystals of the oxide semiconductor thin film are arranged in a columnar shape" means that the crystals observed from the substrate to the surface of the sample using a transmission electron microscope (TEM) have an approximately elliptical shape having an aspect ratio of 1.2 or more, the long side of each crystal forms an angle of 40 to 160° with the substrate, and the above structure accounts for 12% or more of the cross-sectional image (i.e., an area of the oxide semiconductor within a 1×1-μm field of view) observed using the TEM. It is preferable that the long side of each crystal form an angle of 60 to 140° (particularly preferably 70 to 120°) with the substrate.

A TEM applies electron beams to a thin sample, and forms an image using the electron beams that have passed through (or have been diffracted by) the sample to observe the microstructure of the sample. The arrangement (lattice fringe) of the atoms in the crystals can be observed (lattice image) at a high magnification. It is also possible to observe polycrystals, crystal defects, and the like. It is also possible to identify a substance or analyze the crystal state from the electron diffraction pattern.

A substance emits element-specific X-rays (characteristic X-rays) when electron beams are applied to the substance. The element can be identified by analyzing the energy of the X-rays (energy dispersive X-ray spectrometry (EDX)). The distribution of each element can be observed by scanning with narrow electron beams (area analysis). The ratio of the elements (composition) can be determined by applying electron beams to one point for several tens of seconds, and analyzing the intensity of emitted X-rays (quantitative analysis).

It is preferable that the crystal grain boundaries of the oxide thin film include 60 to 90% of crystal grain boundaries having a misorientation of 2° or more and less than 15°. It is more preferable that the crystal grain boundaries of the oxide thin film include 70 to 90% (particularly preferably 75 to 90%) of crystal grain boundaries having a misorientation of 2° or more and less than 15°.

The crystal grain boundaries are observed within a 35×35-μm square area, for example.

If the crystal grain boundaries include less than 60% of crystal grain boundaries having a misorientation of 2° or more and less than 15°, the carrier concentration in the thin film may exceed $10^{18}$ $cm^{-3}$ due to a large number of oxygen defects. If the crystal grain boundaries include more than 90% of crystal grain boundaries having a misorientation of 2° or more and less than 15°, a variation in TFT characteristics (e.g., mobility, threshold voltage, and S-factor) may occur.

The crystal grain boundaries of the oxide thin film may be analyzed using an EBSP. More specifically, a pseudo-Kikuchi pattern is analyzed while scanning with electron beams using a scanning electron microscope (SEM) to measure the microscopic crystal orientation and crystal system. The information about each crystal grain can be obtained using the EBSP, differing from X-ray diffraction by which average information is obtained.

It is also possible to analyze the crystal grain orientation distribution (i.e., texture) and the crystal phase distribution from the crystal orientation data. Note that the pseudo-Kikuchi pattern is a band-like pattern that occurs when reflected electrons are diffracted by the atomic plane in the sample when electron beams are applied to the sample. The symmetry of the band corresponds to the crystal system, and the band spacing corresponds to the atomic plane spacing.

The following four types of information are obtained by the EBSP measurement.
(1) Intensity distribution information (e.g., image quality (IQ) map and confidence index (CI) map)
(2) Orientation data information (e.g., inverse pole figure (IPF) map (orientation map), pole figure, and inverse pole figure)
(3) Misorientation data information (e.g., crystal grain boundaries and residual strain map)
(4) Phase information (e.g., phase map due to difference in crystal system)

The potential barrier of the crystal grain boundaries of the oxide thin film may be measured using Kelvin probe force microscopy (KFM).

The KFM technique applies an AC voltage between the conductive probe and the sample while vibrating the probe, and detects the vibrations of the cantilever due to the electrostatic force to measure the surface potential. The height of the potential barrier at each grain boundary can be determined by measuring the local surface potential around the grain boundary.

The potential difference between the maximum value and the minimum value of the surface potential of the oxide thin film (potential barrier of crystal grain boundaries) in a 25×25-μm measurement area is preferably 60 mV or less, more preferably 50 mV or less, and particularly preferably 30 mV or less. If the potential difference exceeds 60 mV, a variation in TFT characteristics in the substrate plane may increase.

The oxide layer (oxide semiconductor thin film) may be formed by sputtering using a sputtering target formed of an oxide that forms the oxide layer.

The details of the oxide layer-forming method are described later in connection with the method for producing a stacked layer structure according to the invention.

The atomic ratio of the elements included in the oxide thin film (oxide layer) according to the invention may be determined by quantitatively analyzing the elements using an inductively coupled plasma atomic emission spectrometer (ICP-AES).

Specifically, when a solution sample is nebulized using a nebulizer, and introduced into an argon plasma (about 6000 to 8000° C.), each element contained in the sample absorbs the thermal energy, and is excited, and the orbital electrons migrate to the orbital at a high energy level from the ground state. The orbital electrons then migrate to the orbital at a lower energy level when about $10^{-7}$ to $10^{-8}$ second has elapsed. In this case, the difference in energy is emitted as light. Since the emitted light has an element-specific wavelength (spectral line), the presence or absence of each element can be determined based on the presence or absence of the spectral line (qualitative analysis).

Since the size of each spectral line (luminous intensity) is in proportion to the number of elements contained in the sample, the element concentration in the sample can be determined by comparison with a standard solution having a known concentration (quantitative analysis).

After specifying the elements contained in the sample by qualitative analysis, the content of each element is determined by quantitative analysis, and the atomic ratio of the elements is calculated from the results.

Patent Document 4 discloses a TFT that includes an $In_2O_3$ thin film that is obtained by forming an amorphous thin film immediately after deposition, and annealing and crystallizing the amorphous thin film.

However, Patent Document 4 is silent about introduction of water during DC sputtering, and microcrystals may be formed when depositing the thin film. Crystal misorientation and the like may occur when the thin film in which the microcrystals are formed is annealed, so that the number of oxygen defects (deficiencies) in the thin film may increase. As a result, the resulting TFT may have normally-on properties, for example.

When microcrystals have been formed in the oxide thin film that forms the oxide layer during deposition, crystal growth from the substrate is hindered by the microcrystals during the annealing (crystallization) step. As a result, the crystals are not arranged in a columnar shape from the surface of the substrate to the surface of the sample, and have an average crystal diameter of less than 1 μm.

The method for producing a stacked layer structure according to the invention (hereinafter may be referred to as "the method according to the invention") produces a stacked layer structure including an oxide layer and an insulating layer, and includes the steps of:
(1) preparing an insulating layer;
(2) forming on the insulating layer an oxide thin film such that the Rrms (root-mean-square-roughness) in a 20×20 μm² area becomes 1.0 to 5.3 Å; and
(3) subjecting the oxide thin film to heat treatment at 150 to 500° C.

A stacked layer structure that includes an oxide layer which has a preferable carrier concentration and a preferable average crystal diameter and of which the crystals are arranged in a columnar shape, can be obtained by producing a stacked layer structure using the method according to the invention that includes the above steps.

(1) Step of Preparing Insulating Layer

The configuration of the insulating layer that may be used in the method according to the invention is the same as the configuration of the insulating layer described above in connection with the stacked layer structure according to the invention. The insulating layer may be formed by an arbitrary method. A known method may be used to form the insulating layer. The insulating layer may be a single layer, or may be a conductive silicon substrate provided with a thermal oxide film (i.e., the thermal oxide film functions as a gate insulating film (i.e., the insulating layer included in the stacked layer structure), and the conductive silicon functions as a gate electrode) or the like.

(2) Step of Forming Oxide Thin Film on Insulating Layer Such that Rrms (Root-Mean-Square-Roughness) in 20×20 µm² Area Becomes 1.0 to 5.3 Å

The oxide layer (oxide thin film) used in the method according to the invention has an amorphous structure immediately after formation. The Rrms (root-mean-square-roughness) of the oxide thin film in a 20×20 µm² area is 1.0 to 5.3 Å, preferably 1.0 to 4.1 Å, and particularly preferably 1.0 to 3.1 Å. If the Rrms of the oxide thin film exceeds 5.3 Å, the crystals of the oxide layer may not arranged in a columnar shape from the surface of the insulating layer (substrate) to the surface of the sample, so that excellent TFT characteristics may not be obtained. Whether or not the crystals of the oxide thin film (oxide layer) are arranged in a columnar shape is determined by observing an area from the substrate to the surface of the sample using a transmission electron microscope (TEM).

The Rrms of the oxide thin film may be determined using an atomic force microscope (AFM). The AFM is a microscope that detects an interatomic force that is applied to the probe and the sample. The probe of the AFM is attached to the end of the cantilever. The probe is brought into contact with the surface of the sample with a small force, and scanned horizontally (X, Y) while feedback-controlling the distance (Z) between the probe and the sample so that the amount of deflection of the cantilever is constant to visualize the surface shape.

In order to control the Rrms of the oxide thin film immediately after formation to 1.0 to 5.3 Å, it is preferable to form the oxide thin film by sputtering in an atmosphere of a mixed gas containing a rare gas and one or more compounds or elements selected from water, oxygen, and nitrous oxide, and it is particularly preferable to form the oxide layer by sputtering in an atmosphere of a mixed gas containing water, for example. It is considered that the oxide crystals are disordered (i.e., amorphousness is improved) by forming the oxide thin film in the presence of water molecules, oxygen molecules, nitrous oxide molecules, or the like, so that the Rrms of the oxide thin film decreases.

The partial pressure ratio of water contained in the sputtering gas (atmosphere) when forming the oxide thin film (oxide layer) is preferably set to 0.1 to 25%. If the partial pressure ratio of water is less than 0.1%, microcrystals may be formed in the thin film immediately after formation, so that the Rrms of the thin film may become larger than 5.3 Å. Secondary crystallization may occur when the thin film in which microcrystals are formed is annealed, so that the number of defects may increase due to crystal misorientation. As a result, an increase in carrier concentration or a decrease in mobility may occur. If the partial pressure ratio of water exceeds 25%, the degree of 5 s orbital overlap of In may decrease due to a significant decrease in film density, so that a decrease in mobility may occur. The partial pressure ratio of water contained in the atmosphere during sputtering is preferably set to 0.7 to 13%, and particularly preferably 1 to 6%.

The partial pressure ratio of oxygen contained in the atmosphere during sputtering is preferably set to 0% or more and less than 30%. If the partial pressure ratio of oxygen contained in the atmosphere gas is 30% or more, a decrease in mobility may occur, or the carrier concentration may become unstable. It is conjectured that the amount of oxygen introduced into the space between the crystal lattices increases so that scattering occurs, or oxygen is easily released from the film and becomes unstable, when the amount of oxygen contained in the atmosphere gas is too large. The partial pressure ratio of oxygen is more preferably 0 to 12%, and still more preferably 0 to 8%.

It is preferable that the oxide layer obtained by the method according to the invention be formed of a material selected from the group consisting of indium oxide, Ga-doped indium oxide, Al-doped indium oxide, Zn-doped indium oxide, and Sn-doped indium oxide.

In order to obtain an oxide layer formed of the above material, it is preferable to form an oxide layer by sputtering using a target formed of an oxide sintered body having the above composition.

The atomic ratio Ga/(Ga+In) in Ga-doped indium oxide is preferably 0.01 to 0.09, more preferably 0.02 to 0.085, and particularly preferably 0.05 to 0.08. If the atomic ratio Ga/(Ga+In) of gallium metal and indium metal in the Ga-doped indium oxide thin film exceeds 0.09, aggregation of Ga (dopant) may occur, so that the Rrms may increase.

The atomic ratio Al/(Al+In) in Al-doped indium oxide is preferably 0.01 to 0.05, more preferably 0.01 to 0.04, and particularly preferably 0.01 to 0.03. If the atomic ratio Al/(Al+In) of aluminum metal and indium metal in the Al-doped indium oxide thin film exceeds 0.05, aggregation of Al (dopant) may occur, so that the Rrms may increase.

The atomic ratio Zn/(Zn+In) in Zn-doped indium oxide is preferably 0.01 to 0.09, and more preferably 0.01 to 0.07. If the atomic ratio Zn/(Zn+In) of indium metal and zinc metal in the Zn-doped indium oxide thin film exceeds 0.09, Zn may not be dissolved in the In site, and may precipitate at the crystal grain boundaries or the like.

The atomic ratio Sn/(Sn+In) in Sn-doped indium oxide is preferably 0.001 to 0.05, and more preferably 0.002 to 0.02. If the atomic ratio Sn/(Sn+In) of tin metal and indium metal in the Sn-doped indium oxide thin film exceeds 0.05, Sn dissolved in In may serve as a donor, so that a semiconductor may not be obtained due to an increase in carrier concentration.

In order to decrease the electrical resistance of the sputtering target, an element that may have a positive valence of 4 or more, such as Sn, Ti, Si, Ce, or Zr may be added to the oxide semiconductor target in a ratio of 3 wt % or less. In particular, Sn has a significant effect of improving the sintering density and decreasing the electrical resistance of the target. The content of the element that may have a positive valence of 4 or more is preferably 2 wt % or less, and particularly preferably 1 wt % or less. If the content of the element that may have a positive valence of 4 or more exceeds 3 wt %, it may be difficult to decrease the carrier concentration in the oxide semiconductor thin film.

In the method according to the invention, the oxide layer may suitably be formed by DC (direct-current) sputtering, AC (alternating-current) sputtering, RF sputtering, pulsed DC sputtering, or the like. When using DC sputtering, it is expected that the power supply unit can be simplified. When using AC sputtering, it is expected that excellent large area uniformity can be achieved on an industrial scale, and the utilization efficiency of the target can be improved. When using RF sputtering, it is expected that mild sputtering target sintering conditions can be employed since discharge occurs even if the target has high resistance.

The substrate temperature when forming the oxide layer by sputtering is preferably 20 to 120° C., more preferably 25 to 100° C., and particularly preferably 25 to 90° C. If the substrate temperature when forming the oxide layer by sputtering is more than 120° C., microcrystals may be formed in the thin film immediately after formation, and the carrier concentration in the crystallized thin film may exceed $10^{18}/cm^3$. If the substrate temperature when forming the oxide layer by sputtering is less than 25° C., the mobility of the resulting TFT may decrease due to a decrease in density of the thin film.

The distance between the target and the substrate in the direction perpendicular to the surface of the substrate is preferably 1 to 15 cm, and more preferably 2 to 8 cm. If the distance between the target and the substrate is less than 1 cm, the kinetic energy of the particles of the constituent elements of the target that reach the substrate may increase, so that a film having excellent properties may not be obtained. Moreover, an in-plane distribution of the thickness and the electrical properties may occur. If the distance between the target and the substrate exceeds 15 cm, the kinetic energy of the particles of the constituent elements of the target that reach the substrate may decrease to a large extent, so that a dense film may not be obtained (i.e., excellent semiconductor properties may not be obtained).

It is desirable to form the oxide thin film by sputtering in an atmosphere having a magnetic field intensity of 300 to 1500 gausses. If the magnetic field intensity is less than 300 gausses, it may be impossible to form the oxide thin film by sputtering when using a high-resistance sputtering target due to a decrease in plasma density. If the magnetic field intensity is exceeds 1500 gausses, it may be difficult to appropriately control the thickness and the electrical properties of the film.

The pressure of the gas atmosphere (sputtering pressure) is not particularly limited as long as plasma can be stably discharged, but is preferably 0.1 to 3.0 Pa. The sputtering pressure is more preferably 0.1 to 1.5 Pa, and particularly preferably 0.1 to 1.0 Pa. If the sputtering pressure exceeds 3.0 Pa, the mean free path of the sputtered particles may decrease, so that the density of the thin film may decrease. If the sputtering pressure is less than 0.1 Pa, microcrystals may be formed in the film during sputtering. Note that the sputtering pressure refers to the total pressure in the system when starting sputtering after introducing argon, water, oxygen, and the like into the system.

In the step (2), the oxide layer may be formed by AC sputtering as described below.

Specifically, substrates are sequentially carried at positions opposite to three or more targets arranged in parallel in a vacuum chamber with a predetermined distance being provided therebetween, and a negative potential and a positive potential are alternately applied to each target from alternating power sources to generate plasma on the targets to form the oxide layer on the substrate.

In this case, at least one of the outputs from the alternating power sources is applied to two or more targets that are connected in a branched manner while switching the targets. Specifically, at least one of the outputs from the alternating power sources is connected to two or more targets in a branched manner, and the oxide layer is formed while applying a different potential to the adjacent targets.

In order to control the Rrms of the oxide thin film immediately after formation to 1.0 to 5.3 Å when forming the oxide layer by AC sputtering, it is preferable to form the oxide layer by sputtering in an atmosphere of a mixed gas containing a rare gas and one or more compounds or elements selected from water, oxygen, and nitrous oxide, and it is particularly preferable to form the oxide layer by sputtering in an atmosphere of a mixed gas containing water, for example.

When using AC sputtering, it is expected that an oxide layer that exhibits excellent large area uniformity can be obtained on an industrial scale, and the utilization efficiency of the target can be improved.

When forming the oxide layer on a large-area substrate (i.e., a substrate having a side dimension of more than 1 m), it is preferable to use an AC sputtering system for a large-area substrate as disclosed in JP-A-2005-290550, for example.

Figure 8:
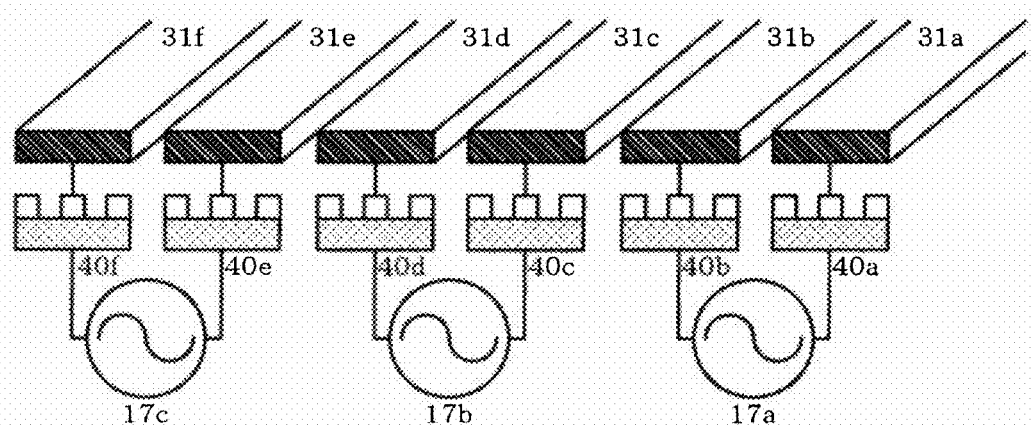
FIG. 8 is a schematic view illustrating the main part of a sputtering source of an AC (alternating-current) sputtering system used in Examples 14 to 18 and Comparative Example 8.

The AC sputtering system disclosed in JP-A-2005-290550 includes a vacuum chamber, a substrate holder that is disposed in the vacuum chamber, and a sputtering source that is disposed at a position opposite to the substrate holder. FIG. 8 illustrates the main part of the sputtering source included in the AC sputtering system. The sputtering source includes a plurality of sputtering sections that respectively include plate-like targets 31a to 31f. When the surface of each target subjected to sputtering is referred to as "sputtering surface", each sputtering section is disposed so that the sputtering surface is positioned in the same plane. The targets 31a to 31f are formed to be elongated in the longitudinal direction, and have an identical shape. The targets 31a to 31f are disposed in parallel so that the edge area (side surface) of the sputtering surface in the longitudinal direction is positioned at an interval from the edge area of the sputtering surface of the adjacent target. Therefore, the side surfaces of the targets 31a to 31f are positioned parallel to each other.

Alternating power sources 17a to 17c are disposed outside the vacuum chamber. One of the two terminals of each alternating power source (17a to 17c) is connected to one of two adjacent electrodes, and the other of the two terminals of each alternating power source is connected to the other of the two adjacent electrodes. The terminals of each alternating power source (17a to 17c) respectively output voltages that differ in polarity. Since the targets 31a to 31f are attached to the electrodes, AC voltages that differ in polarity are applied to the adjacent targets 31a to 31f from the alternating power sources 17a to 17c. Therefore, a positive potential is applied to one of the adjacent targets, and a negative potential is applied to the other of the adjacent targets.

Magnetic field-forming means 40a to 40f are disposed on the side of the electrodes opposite to the targets 31a to 31f. Each of the magnetic field-forming means 40a to 40f includes an elongated ring-like magnet having outer circumferential dimensions approximately equal to those of the targets 31a to 31f, and a rod-like magnet that is shorter than the ring-like magnet.

The ring-like magnets are disposed in parallel to the longitudinal direction of the targets 31a to 31f at a position opposite to the corresponding target. Since the targets 31a to 31f are disposed in parallel at a given interval, the ring-like magnets are disposed at the given interval in the same manner as the targets 31a to 31f.

The alternating current density when performing AC sputtering using an oxide target is preferably 3 to 20 $W/cm^2$ (3 $W/cm^2$ or more and 20 $W/cm^2$ or less). If the alternating current density is less than 3 $W/cm^2$, it is not economical from the viewpoint of production due to a low deposition rate. If the alternating current density exceeds 20 W/cm², the target may break. The alternating current density is more preferably 4 to 15 W/cm².

The partial pressure of water during AC sputtering is preferably $5 \times 10^{-3}$ to $5 \times 10^{-1}$ Pa. If the partial pressure of water is less than $5 \times 10^{-3}$ Pa, microcrystals may be formed in the thin film immediately after deposition, so that the Rrms of the thin film may become larger than 5.3 Å. If the partial pressure of water exceeds $5 \times 10^{-1}$ Pa, the degree of 5 s orbital overlap of In may decrease due to a significant decrease in film density, so that a decrease in mobility may occur. The partial pressure of water during sputtering is preferably $1 \times 10^{-2}$ to $1 \times 10^{-1}$ Pa when the alternating current density is 5 W/cm².

The AC sputtering frequency is preferably 10 kHz to 1 MHz. If the AC sputtering frequency is less than 10 kHz, noise may occur. If the AC sputtering frequency exceeds 1 MHz, sputtering may occur at a position other than the desired target position due to an increase in distribution of plasma, so that uniformity may be impaired. The AC sputtering frequency is more preferably 20 to 500 kHz.

The sputtering conditions other than the above items may be appropriately selected.

(3) Step of Subjecting Thin Film to Heat Treatment at 150 to 500° C.

In the step (3), the amorphous oxide thin film obtained by the steps (1) and (2) is subjected to heat treatment (i.e., annealed) to obtain a crystalline oxide thin film.

More specifically, the amorphous oxide thin film obtained by the steps (1) and (2) that has an Rrms (root-mean-square-roughness) of 1.0 to 5.3 Å is crystallized to obtain an oxide layer (crystalline oxide thin film). The annealing temperature is preferably 150 to 400° C., and more preferably 200 to 350° C. If the annealing temperature is less than 150° C., crystallization may be insufficient. If the annealing temperature exceeds 500° C., the device may break.

The annealing (crystallization) time is normally 10 minutes to 3.5 hours, and preferably 15 minutes to 2.5 hours.

When the amorphous oxide thin film obtained by the steps (1) and (2) is subjected to the heat treatment (i.e., annealed), the dopants are dissolved in the indium oxide crystals, so that a single-phase bixbyite structure is obtained.

It is preferable to crystallize the oxide layer before forming a protecting film. If the amorphous thin film is exposed to plasma, the subsequent crystallization process may be adversely affected by plasma damage, so that lattice defects or the like may occur in the film.

The atmosphere employed when subjecting the amorphous oxide thin film to the heat treatment (annealing) is not particularly limited, but is preferably air or an oxygen atmosphere from the viewpoint of carrier control. The oxide thin film may be subjected to the heat treatment (annealing) in the presence or absence of oxygen using a lamp annealing system, a laser annealing system, a thermal plasma system, a hot-blast heating system, a contact heating system, or the like.

When controlling the Rrms of the amorphous structure immediately after formation (deposition) of the oxide thin film to 1.0 to 5.3 Å, and then annealing (crystallizing) the oxide thin film (oxide layer), the crystals of the oxide thin film are arranged in a columnar shape from the surface of the substrate to the surface of the sample.

Since the oxide thin film in which the crystals are arranged in a columnar shape has a small crystal misorientation and a low trap density, a TFT that exhibits improved field-effect mobility and a good S-factor can be formed with high reproducibility.

It is also possible to control the carrier concentration to $10^{18}$/cm³ or less due to a small number of oxygen defects (deficiencies).

When forming the film while introducing water in order to suppress formation of microcrystals, the crystals are grown from the substrate in a columnar shape during the heat treatment (annealing) step. In the film in which the crystals are arranged in a columnar shape on surface of the substrate, crystal growth is not hindered by microcrystals during the annealing (crystallization) step. Therefore, the crystal diameter increases as compared with a thin film that is formed without introducing water, and the average crystal diameter becomes 1 μm or more.

It is preferable that the oxide semiconductor thin film (oxide layer) after annealing (crystallization) have an average crystal diameter of 1 to 27 μm. It is more preferable that the thin film have an average crystal diameter of 1.3 to 27 μm, and particularly preferably 2.1 to 27 μm. If the average crystal diameter of the thin film is less than 1 μm, microcrystals may have been formed in the thin film when forming the thin film. If the average crystal diameter of the thin film exceeds 27 μm, a variation in TFT characteristics may occur due to scattering of carriers at the crystal grain boundaries.

In the method according to the invention, the amorphous film having an Rrms of 1.0 to 5.3 Å immediately after deposition is crystallized by the heat treatment (annealing). The crystallized oxide thin film (oxide layer) substantially has an $In_2O_3$ bixbyite structure. Note that the expression "substantially has an $In_2O_3$ bixbyite structure" means that the oxide layer (crystalline oxide thin film) exhibits the effects of the invention due to the bixbyite structure, or 70% or more (preferably 80% or more, and more preferably 85% or more) of the crystal structure of the crystalline oxide thin film has a bixbyite structure.

The oxide layer (oxide thin film) included in the stacked layer structure obtained by the method according to the invention is a thin film formed of indium and oxygen, a thin film formed of indium, oxygen, and gallium, a thin film formed of indium, oxygen, and aluminum, a thin film formed of indium, oxygen, and zinc, or a thin film formed of indium, oxygen, and tin. The oxide layer may include unavoidable impurities as long as the oxide layer mainly include the above elements. Note that it is desirable that the crystal structure substantially have only an indium oxide bixbyite structure.

Since a thin film having an indium oxide bixbyite structure that is obtained by controlling the Rrms of the oxide thin film (oxide layer) to 1.0 to 5.3 Å, and then annealing (crystallizing) the oxide thin film (oxide layer) has a configuration in which the crystals of the oxide thin film are arranged in a columnar shape from the surface of the substrate to the surface of the thin film, excellent TFT characteristics can be achieved.

Whether or not the oxide thin film (oxide layer) has an indium oxide bixbyite structure may be determined by X-ray diffraction (XRD) measurement.

Note that intense X-rays are observed in a specific direction when X-rays are incident on a crystal in which atoms are arranged regularly, so that a diffraction phenomenon occurs. Specifically, when the optical path difference of X-rays scattered at each position is an integral multiple of the wavelength of the X-rays, the amplitude of the waves increases since the phases of the waves coincide, so that the diffraction phenomenon occurs.

Since a substance forms a crystal having specific regularity, the type of compound can be identified by utilizing X-ray diffraction. It is also possible to evaluate the size of crystals (crystalline order), the distribution state of the orientation of crystals present in the material (crystal orientation), and the residual stress applied to the crystals.

The density of the oxide layer (oxide thin film) obtained by the method according to the invention is preferably 6.2 g/cm$^3$ or more, and more preferably 6.4 g/cm$^3$ or more. If the density of the oxide layer (oxide thin film) is less than 6.2 g/cm$^3$, the degree of 5 s orbital overlap of In that takes part in carrier conduction may decrease, so that a decrease in mobility may occur.

It is preferable that the oxide layer (oxide thin film) obtained by the method according to the invention have a high density. The density of the oxide layer (oxide thin film) obtained by the method according to the invention is particularly preferably set to 6.2 to 7.1 g/cm$^3$.

A stacked layer structure produced by the method according to the invention has the same structure and properties as those of the stacked layer structure according to the invention.

The oxide thin film according to the invention and a stacked layer structure produced by the method according to the invention may be used for a thin film transistor. In particular, the oxide layer included in the stacked layer structure may be used as a channel layer.

The thin film transistor according to the invention includes the oxide layer and the insulating layer included in the stacked layer structure according to the invention as a channel layer and a gate insulating film, respectively, and also includes a protecting film that includes $SiN_x$ or the like on the oxide layer.

The channel layer included in the thin film transistor according to the invention is formed of the oxide layer included in the stacked layer structure according to the invention. The oxide layer (channel layer) has the above configuration and the like.

The gate insulating film included in the thin film transistor according to the invention is formed of the insulating layer included in the stacked layer structure according to the invention. The insulating layer (gate insulating film) has the above configuration and the like.

The oxide layer included in the stacked layer structure according to the invention is a crystalline oxide thin film having a controlled crystal orientation and crystal diameter. When using the oxide layer as a channel layer, oxygen defects (deficiencies) rarely occur during the production process (e.g., CVD), and a deterioration in TFT characteristics does not occur.

The thickness of the channel layer of the thin film transistor according to the invention is normally 10 to 300 nm, preferably 20 to 250 nm, more preferably 30 to 200 nm, still more preferably 35 to 120 nm, and particularly preferably 40 to 80 nm. If the thickness of the channel layer is less than 10 nm, an in-plane non-uniformity in TFT characteristics may occur due to non-uniformity in thickness when forming the channel layer over a large area. If the thickness of the channel layer exceeds 300 nm, it may take time to form the channel layer (i.e., industrial application may be difficult).

The channel layer included in the thin film transistor according to the invention is normally used as an N-type region, and may be used for various semiconductor devices (e.g., PN-junction transistor) in combination with a p-type semiconductor (e.g., P-type Si semiconductor, P-type oxide semiconductor, or P-type organic semiconductor).

The protecting film included in the thin film transistor according to the invention preferably includes $SiN_x$. $SiN_x$ can form a dense film as compared with $SiO_2$, and can suppress a deterioration in TFT.

The protecting film may be stacked on the channel layer.

The protecting film can be formed directly on the channel layer without forming a buffer layer by utilizing the oxide layer included in the stacked layer structure according to the invention as the channel layer. This makes it possible to simplify the production process.

The protecting film may include $SiO_2$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTi_3$, $BaTa_2O_6$, $Sm_2O_3$, $SrTiO_3$, AlN, or the like in addition to $SiN_x$. It is preferable that the protecting film substantially include only $SiN_x$. Note that the expression "substantially include only $SiN_x$" means that 70 wt % or more (preferably 80 wt % or more, and more preferably 85 wt % or more) of the thin film that forms the protecting film included in the thin film transistor according to the invention is $SiN_x$.

It is preferable to subject the oxide semiconductor film to an ozone treatment, an oxygen plasma treatment, a nitrogen dioxide plasma treatment, or a nitrous oxide plasma treatment as a pretreatment before forming the protecting film. The above treatment may be performed on the oxide semiconductor film at an arbitrary timing before forming the protecting film. Note that it is desirable to perform the above treatment immediately before forming the protecting film. This makes it possible to suppress occurrence of oxygen defects in the oxide semiconductor film.

When hydrogen is diffused into the oxide semiconductor film when the TFT is driven, a shift in threshold voltage may occur, so that the reliability of the TFT may deteriorate. An In—OH bond in the crystal structure is stabilized by subjecting the oxide semiconductor film to an ozone treatment, an oxygen plasma treatment, a nitrogen dioxide plasma treatment, or a nitrous oxide plasma treatment, so that diffusion of hydrogen in the oxide semiconductor film can be suppressed.

The gate insulating film is formed by plasma chemical vapor deposition (CVD), for example. When the gate insulating film is formed by plasma CVD, and the oxide semiconductor layer is formed on the gate insulating film, hydrogen contained in the gate insulating film may be diffused into the oxide semiconductor layer, so that a deterioration in crystallinity of the oxide semiconductor layer or a deterioration in reliability of the TFT may occur.

It is preferable to subject the gate insulating film to an ozone treatment, an oxygen plasma treatment, a nitrogen dioxide plasma treatment, or a nitrous oxide plasma treatment before forming the oxide semiconductor layer in order to prevent a deterioration in crystallinity of the oxide semiconductor layer or a deterioration in reliability of the TFT. This makes it possible to suppress a deterioration in crystallinity of the oxide semiconductor layer or a deterioration in reliability of the TFT.

The thickness of the gate insulating film is normally 5 to 400 nm, and preferably 50 to 300 nm.

A material used to form each electrode (i.e., drain electrode, source electrode, and gate electrode) included in the thin film transistor according to the invention is not particularly limited. A known material may be arbitrarily selected as the material used to form each electrode. For example, a transparent electrode material (e.g., ITO, IZO, ZnO, or $SnO_2$), a metal electrode material (e.g., Al, Ag, Cu, Cr, Ni, Mo, Au, Ti, or Ta), or an alloy thereof may be used to form each electrode.

Each electrode (i.e., drain electrode, source electrode, and gate electrode) may have a multilayer structure in which two or more different conductive layers are stacked. In particular, the source/drain electrode may have a structure in which a good conductor such as Al or Cu is sandwiched between a metal that exhibits excellent adhesion (e.g., Ti or Mo), since a reduction in resistance is strongly desired.

The thin film transistor according to the invention may be used as a field effect transistor, and may also be applied to an integrated circuit (e.g., logic circuit, memory circuit, or differential amplifier circuit). The thin film transistor according to the invention may also be used as a static induction transistor, a Schottky barrier transistor, a Schottky diode, and a resistor element.

The thin film transistor according to the invention may have an arbitrary known configuration (e.g., bottom gate configuration, bottom contact configuration, or top contact configuration).

It is advantageous that the thin film transistor have a bottom gate configuration since high performance can be achieved as compared with an amorphous silicon or ZnO thin film transistor. Moreover, since the number of masks used during the production can be reduced, the production cost can be reduced (e.g., when producing a large display).

The thin film transistor according to the invention may suitably be used for a display apparatus.

It is preferable that the thin film transistor be a channel-etch thin film transistor having a bottom gate configuration when used for a large-area display. When using a channel-etch thin film transistor having a bottom gate configuration, a display panel can be produced at low cost since the number of photomasks used during photolithography can be reduced. It is particularly preferable that the thin film transistor be a channel-etch thin film transistor having a bottom gate-top contact configuration from the viewpoint of an increase in mobility and the like, and ease of industrial production.

EXAMPLES

Examples 1 to 13

[1] Fabrication of Hall Effect Measurement Device, XRD Evaluation Device, AFM Evaluation Device, SIM Evaluation Device, and Cross-Sectional TEM Evaluation Device A 4-inch target formed of an oxide having the composition shown in Table 1, and a slide ("#1737" manufactured by Corning) as a substrate (insulating layer included in stacked layer structure) were placed in a magnetron sputtering system. An amorphous film having a thickness of 50 nm was formed on the slide by DC magnetron sputtering under the following conditions. Ar gas, $O_2$ gas, and $H_2O$ gas were introduced when forming the amorphous film in the partial pressure ratio shown in Table 1. The substrate on which the amorphous film was formed was heated at 300° C. for 1 hour in air to crystallize the amorphous film to obtain an oxide semiconductor film (oxide layer included in stacked layer structure).

It was confirmed by ICP-AES analysis that the atomic ratio of the elements contained in the crystallized oxide thin film was the same as that of the sputtering target.

The Hall effect measurement device was placed in a "ResiTest 8300" system (manufactured by Toyo Corporation), and the Hall effect was evaluated at room temperature. The results are shown in Table 1.

The sputtering conditions are shown below.
Substrate temperature: 25° C.
Ultimate pressure: $8.5 \times 10^{-5}$ Pa
Atmosphere gas: Ar gas, $O_2$ gas, and $H_2O$ gas (the partial pressure ratio is shown in Table 1)
Sputtering pressure (total pressure): 0.4 Pa
Power supplied: DC 100 W
S-T distance (substrate-target distance): 70 mm

[2] Fabrication of Thin Film Transistor

A conductive silicon substrate provided with a thermal oxide film (thickness: 100 nm) was used as a substrate. The sputtering conditions were the same as those employed in [1]. The thermal oxide film functions as a gate insulating film (insulating layer included in stacked layer structure), and the conductive silicon functions as a gate electrode.

An amorphous thin film having a thickness of 50 nm was formed on the gate insulating film by sputtering under the conditions shown in Table 1. A resist ("OFPR #800" manufactured by Tokyo Ohka Kogyo Co., Ltd.) was applied to the amorphous thin film, pre-baked (80° C., 5 minutes), and exposed. The resist was then developed, post-baked (120° C., 5 minutes), and etched using oxalic acid to pattern the resist into the desired shape. The thin film was then annealed at 300° C. for 1 hour in a hot-blast heating furnace to crystallize the thin film.

An Mo film (200 nm) was then formed by sputtering. Source/drain electrodes having the desired shape were patterned by channel etching. An $SiN_x$ film (protecting film) was then formed by plasma-enhanced CVD (PECVD). A contact hole was formed using hydrofluoric acid to obtain a thin film transistor.

[3] Measurement of Field-Effect Mobility (μ), S-Factor, and Threshold Voltage (Vth) of Thin Film Transistor The field-effect mobility (μ), the S-factor, and the threshold voltage (Vth) of the thin film transistor were evaluated. The field-effect mobility (μ), the S-factor, and the threshold voltage (Vth) were measured at room temperature in a shading environment (in a shield box) using a semiconductor parameter analyzer ("4200SCS" manufactured by Keithley Instruments Inc.). The drain voltage (Vd) was set to 10 V. The results are shown in Table 1.

[4] Evaluation of Crystallinity by X-Ray Diffraction (XRD) Measurement

The crystal structure of the thin film formed on the glass substrate was determined using an X-ray diffraction measurement system ("Ultima-III" manufactured by Rigaku Corporation). FIG. 1 shows the X-ray diffraction chart of the thin films of Examples 1 to 3 immediately after deposition.

Figure 2:
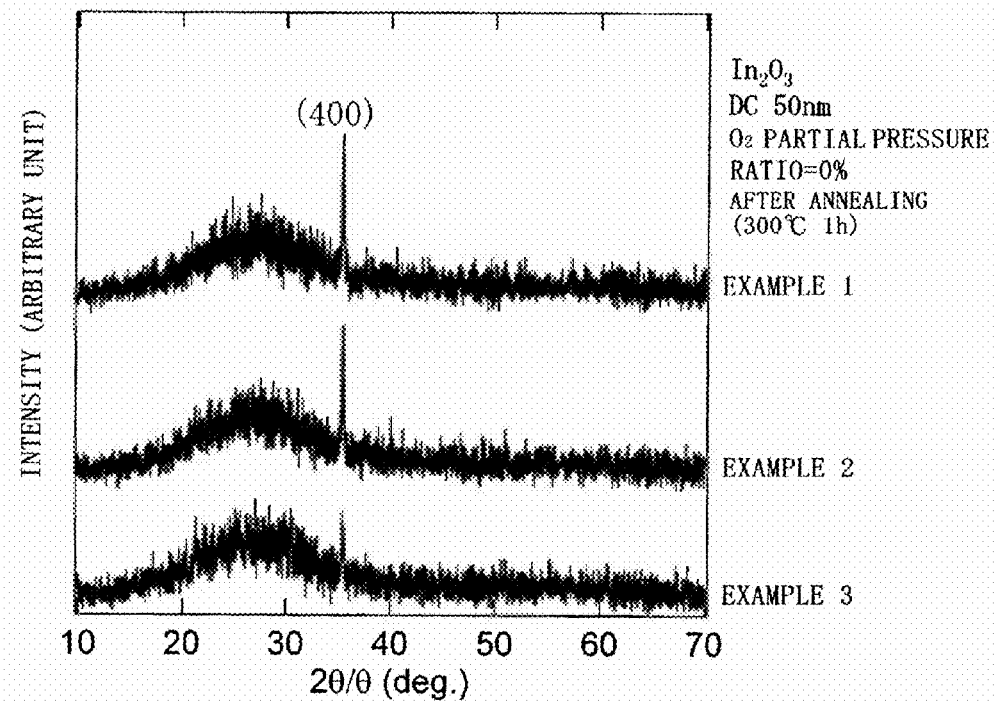
FIG. 2 shows the X-ray diffraction chart of a thin film formed on a glass substrate (after annealing) (Examples 1 to 3).

A diffraction peak was not observed (i.e., the thin film was amorphous) immediately after deposition. A diffraction peak was observed (i.e., the thin film was crystallized) after annealing at 300° C. for 1 hour in air. FIG. 2 shows the X-ray diffraction chart of the thin films of Examples 1 to 3 after annealing.

As a result of analyzing the X-ray diffraction chart, only an indium oxide bixbyite structure was observed in the crystallized thin films of Examples 1 to 3. The indium oxide bixbyite crystal structure is listed on a Joint Committee of Powder Diffraction Standards (JCPDS) card. The JCPDS card No. of the indium oxide bixbyite structure is 06-0416.

The thin films of Examples 4 to 13 were also amorphous immediately after deposition, and only an indium oxide bixbyite structure was observed after annealing at 300° C. for 1 hour in air.

The XRD measurement conditions are shown below.
System: "Ultima-III" manufactured by Rigaku Corporation
X-rays: Cu-Kα radiation (wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm

[5] Evaluation of Rrms (Root-Mean-Square-Roughness) of Oxide Thin Film Using Atomic Force Microscope (AFM)

The Rrms (in a 20×20 μm² area) of the surface of the thin film of Example 1 formed on the glass substrate was measured immediately after deposition using an AFM system ("JSPM-4500" manufactured by JEOL Ltd.), and found to be 2.3 Å (i.e., very flat). Table 1 also shows the Rrms of the thin films of Examples 2 to 13.

[6] Evaluation of Crystal Diameter Using Scanning Ion Microscopy (SIM)

The thin film of Example 1 formed on the glass substrate was subjected to SIM measurement. A focused ion beam system "FB-2100" (manufactured by Hitachi, Ltd.) was used for the measurement. The accelerating voltage was set to 40 kV.

Figure 3:
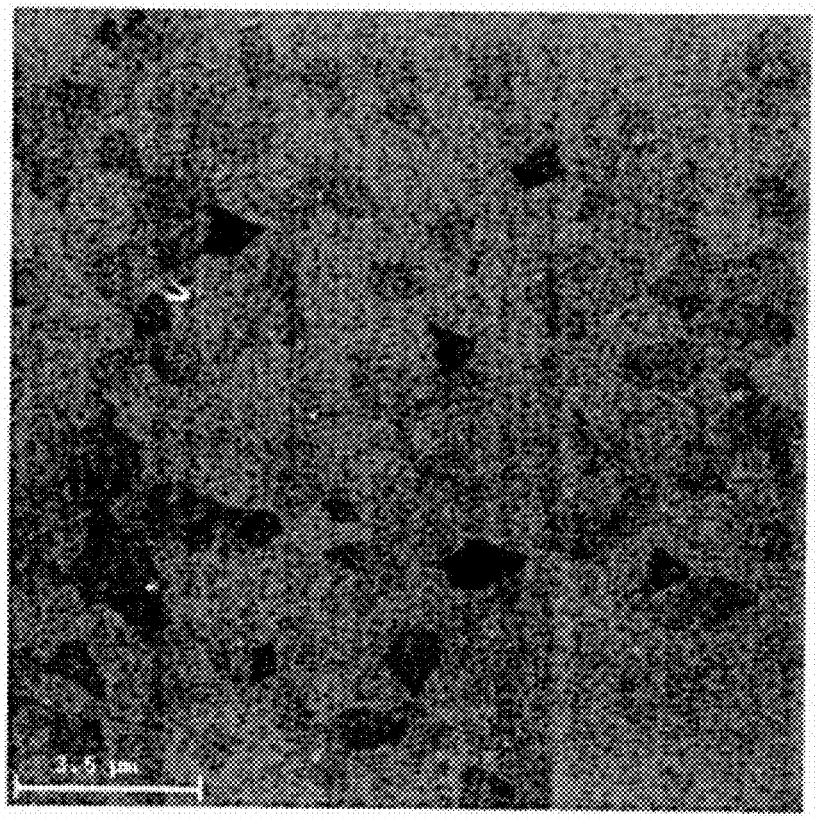
FIG. 3 shows the scanning ion microscope (SIM) image of the thin film of Example 1 formed on a glass substrate (after annealing (crystallization) at 300° C. for 1 hour) (i.e., a partial enlarged view of the SIM image (35×35-μm square area) at a magnification of 10,000).

FIG. 3 shows the SIM image of the thin film of Example 1 after annealing (crystallization) at 300° C. for 1 hour. Note that FIG. 3 is a partial enlarged view of the SIM image (35×35-μm square area) at a magnification of 10,000.

Crystal grains were observed, and the average crystal diameter was 2.1 μm.

The average crystal diameter of the oxide semiconductor thin film was determined by measuring the maximum diameter of each crystal grain observed within a 35×35-μm square area, and calculating the average value of the maximum diameters. The average crystal diameter of the thin films of Examples 2 to 13 is shown in Table 1.

[7] Evaluation of Crystal Morphology Using Cross-Sectional Transmission Electron Microscope (TEM)

The thin film of Example 1 formed on the glass substrate was subjected to cross-sectional TEM measurement. A field emission transmission electron microscope "HF-2100" (manufactured by Hitachi, Ltd.) was used for the measurement. The accelerating voltage was set to 200 kV.

Figure 4:
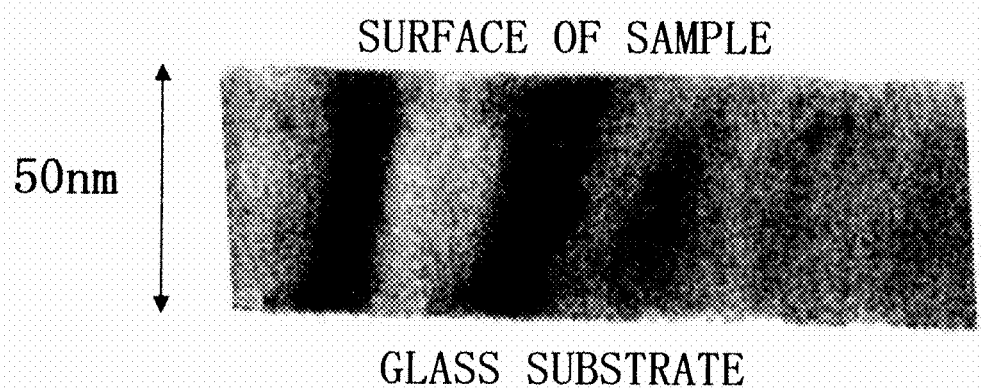
FIG. 4 shows the transmission electron microscope (TEM) image of the cross section of the thin film of Example 1 formed on a glass substrate (after annealing (crystallization) at 300° C. for 1 hour) (i.e., a partial enlarged view of the oxide thin film (1×1-μm square area) at a magnification of 100,000).

FIG. 4 shows the cross-sectional TEM image of the thin film of Example 1 after annealing (crystallization) at 300° C. for 1 hour. Note that FIG. 4 is a partial enlarged view of the oxide thin film within a 1×1-μm square field of view at a magnification of 100,000.

As shown in FIG. 4, the crystals were arranged in a columnar shape from the surface of the substrate to the surface of the sample.

In the thin films of Examples 2 to 13, the crystals were also arranged in a columnar shape from the surface of the substrate to the surface of the sample.

Comparative Examples 1 to 7

A thin film transistor and a thin film evaluation device were fabricated, and evaluated in the same manner as in Example 1, except that the target used to form the oxide semiconductor film, the sputtering conditions, and the annealing conditions were changed as shown in Table 2. The results are shown in Table 2.

[1] Evaluation of Crystallinity by XRD

Figure 5:
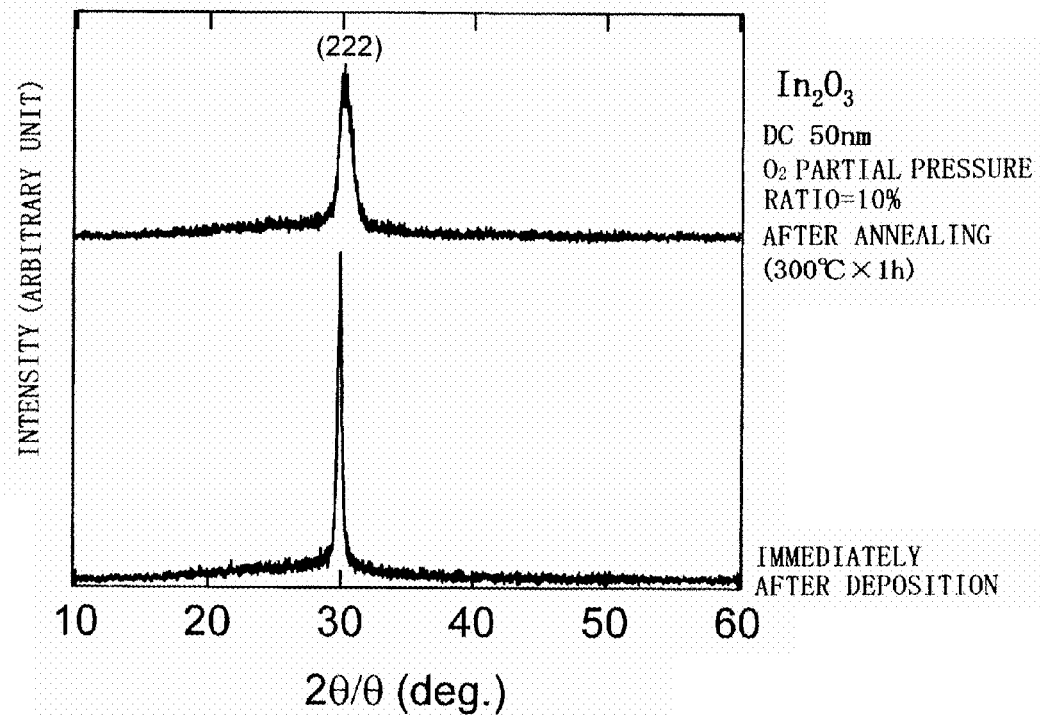
FIG. 5 shows the X-ray diffraction chart of a thin film formed on a glass substrate (immediately after deposition and after annealing) (Comparative Example 1).

The crystal structure of the thin film formed on the glass substrate was determined in the same manner as in Examples 1 to 13 immediately after deposition and after annealing using an X-ray diffraction measurement system ("Ultima-III" manufactured by Rigaku Corporation). FIG. 5 shows the X-ray diffraction chart of the thin film of Comparative Example 1.

A diffraction peak was observed (i.e., the thin film was crystallized) immediately after deposition. The half-width of the diffraction peak increased due to annealing at 300° C. for 1 hour in air.

As a result of analyzing the X-ray diffraction chart, only an indium oxide bixbyite structure was observed in the thin film of Comparative Example 1.

The thin films of Comparative Examples 4 and 6 were amorphous immediately after deposition, and crystallized after annealing at 300° C. for 1 hour in air. Only an indium oxide bixbyite structure was observed in the thin films of Comparative Examples 4 and 6.

[2] Evaluation of Rrms of Oxide Thin Film Using AFM

The Rrms (in a 20×20 μm$^2$ area) of the surface of the thin film of Comparative Example 1 formed on the glass substrate was measured immediately after deposition using an AFM system ("JSPM-4500" manufactured by JEOL Ltd.), and found to be 8.6 Å (i.e., the surface of the thin film of Comparative Example 1 was rough as compared with Examples 1 to 13). Table 2 also shows the Rrms of the thin films of Comparative Examples 2 to 7.

[3] Evaluation of Crystal Diameter Using SIM

The thin film of Comparative Example 1 formed on the glass substrate was subjected to SIM measurement in the same manner as in Examples 1 to 13. A focused ion beam system "FB-2100" (manufactured by Hitachi, Ltd.) was used for the measurement. The accelerating voltage was set to 40 kV.

Figure 6:
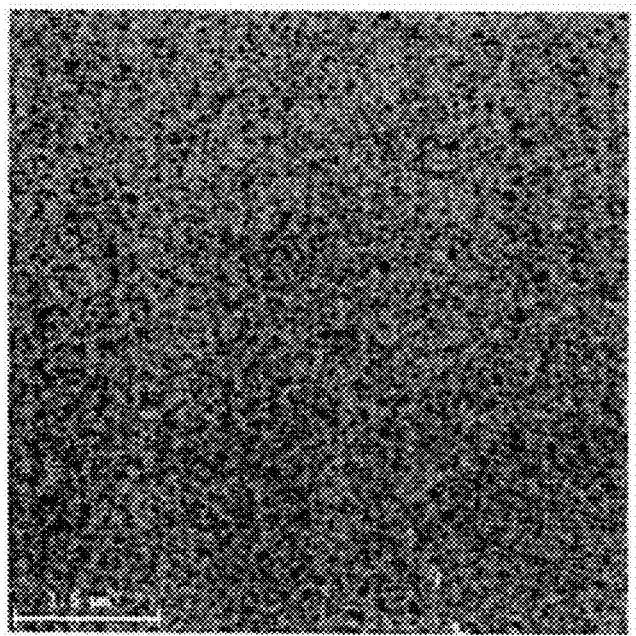
FIG. 6 shows the scanning ion microscope (SIM) image of the thin film of Comparative Example 1 formed on a glass substrate (after annealing (crystallization) at 300° C. for 1 hour) (i.e., a partial enlarged view of the SIM image (35×35-μm square area) at a magnification of 10,000).

FIG. 6 shows the SIM image of the thin film of Comparative Example 1 after annealing (crystallization) at 300° C. for 1 hour. Note that FIG. 6 is a partial enlarged view of the SIM image (35×35-μm square area) at a magnification of 10,000.

Crystal grains were observed, and the average crystal diameter was 0.57 μm.

The average crystal diameter of the oxide semiconductor thin film was determined by measuring the maximum diameter of each crystal grain observed within a 35×35-μm square area, and calculating the average value of the maximum diameters. The average crystal diameter of the thin films of Comparative Examples 2 to 7 is shown in Table 2. The average crystal diameter of the thin films of Comparative Examples 2 to 7 was less than 1 μm.

[4] Evaluation of Crystal Morphology Using Cross-Sectional TEM

The thin film of Comparative Example 1 formed on the glass substrate was subjected to cross-sectional TEM measurement in the same manner as in Examples 1 to 13. A field emission transmission electron microscope "HF-2100" (manufactured by Hitachi, Ltd.) was used for the measurement. The accelerating voltage was set to 200 kV.

Figure 7:
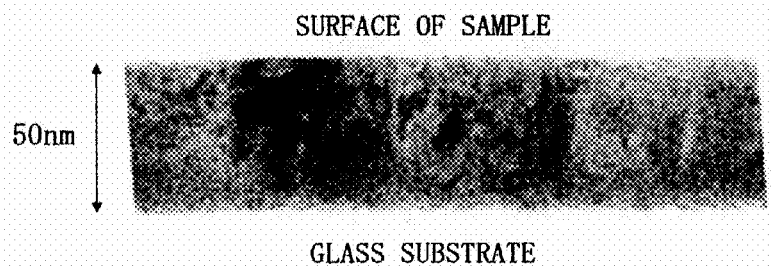
FIG. 7 shows the transmission electron microscope (TEM) image of the cross section of the thin film of Comparative Example 1 formed on a glass substrate (after annealing (crystallization) at 300° C. for 1 hour) (i.e., a partial enlarged view of the oxide thin film (1×1-μm square area) at a magnification of 100,000).

FIG. 7 shows the cross-sectional TEM image of the thin film of Comparative Example 1 after annealing at 300° C. for 1 hour. Note that FIG. 7 is a partial enlarged view of the oxide thin film within a 1×1-μm square field of view at a magnification of 100,000.

As shown in FIG. 7, microcrystals were observed in the thin film of Comparative Example 1. Microcrystals were also observed in the thin films of Comparative Examples 2 to 7.

[5] Evaluation of Device

The Hall effect measurement device was placed in a "ResiTest 8300" system (manufactured by Toyo Corporation), and the Hall effect was evaluated at room temperature. The results are shown in Table 2. The carrier concentration in the thin films of Comparative Examples 1 to 7 was more than $10^{18}$ cm$^{-3}$. It was thus found that the thin films of Comparative Examples 1 to 7 had a large number of oxygen defects.

The field-effect mobility (μ), the S-factor, and the threshold voltage (Vth) of the thin film transistor were measured at room temperature in a shading environment (in a shield box) using a semiconductor parameter analyzer ("4200SCS" manufactured by Keithley Instruments Inc.). The drain voltage (Vd) was set to 10 V. The results are shown in Table 2. As shown in Table 2, the devices of Comparative Examples 1 to 7 had normally-on properties since the carrier concentration was more than $10^{18}$ cm$^{-3}$.

TABLE 1

| | | Example 1 | Example 2 | Example 3 | Example 4 | Example 5 | Example 6 | Example 7 |
|---|---|---|---|---|---|---|---|---|
| | Composition of target | $In_2O_3$ | $In_2O_3$ | $In_2O_3$ | $In_2O_3$ | $In_2O_3$ | Ga/(In + Ga) = 0.072 | Ga/(In + Ga) = 0.072 |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 | 0.4 | 0.4 | 0.4 |
| | $[H_2O]/([H_2O] + [Ar] + [O_2])$ (%) | 1 | 2 | 6 | 1 | 2 | 1 | 2 |
| | $[Ar]/([H_2O] + [Ar] + [O_2])$ (%) | 99 | 98 | 94 | 97 | 95 | 99 | 98 |
| | $[O_2]/([H_2O] + [Ar] + [O_2])$ (%) | 0 | 0 | 0 | 2 | 3 | 0 | 0 |
| | Partial pressure of water (Pa) | 4.0E-03 | 8.0E-03 | 2.4E-02 | 4.0E-03 | 8.0E-03 | 4.0E-03 | 8.0E-03 |
| | Sputtering method | DC | DC | DC | DC | DC | DC | DC |
| | T-S distance (mm) | 70 | 70 | 70 | 70 | 70 | 70 | 70 |
| | Film thickness (nm) | 50 | 50 | 50 | 50 | 50 | 50 | 50 |
| Annealing | Substrate temperature (°C.) | 25 | 25 | 25 | 25 | 25 | 25 | 25 |
| | Annealing temperature (°C.) | 300 | 300 | 300 | 300 | 300 | 300 | 300 |
| | Annealing time (min) | 60 | 60 | 60 | 60 | 60 | 60 | 60 |
| | Atmosphere | Air | Air | Air | Air | Air | Air | Air |
| XRD | Immediately after deposition | Amorphous | Amorphous | Amorphous | Amorphous | Amorphous | Amorphous | Amorphous |
| | After annealing | Crystalline | Crystalline | Crystalline | Crystalline | Crystalline | Crystalline | Crystalline |
| AFM | Rrms (Å) | 2.3 | 1.8 | 2.8 | 3.1 | 2.9 | 1.7 | 2.1 |
| SIM | Average crystal diameter (μm) | 2.1 | 2.7 | 5.2 | 8.4 | 2.5 | 5.8 | 6.1 |
| TEM | Cross-sectional crystal morphology | Columnar crystal | Columnar crystal | Columnar crystal | Columnar crystal | Columnar crystal | Columnar crystal | Columnar crystal |
| Hall measurement | Carrier concentration ($cm^{-3}$) | 9.37E+17 | 4.83E+17 | 4.94E+17 | 4.77E+17 | 3.23E+17 | 1.19E+17 | 1.75E+17 |
| TFT | Channel width/channel length (μm) | 20/10 | 20/10 | 20/10 | 20/10 | 20/10 | 20/10 | 20/10 |
| | Source/drain | Mo | Mo | Mo | Mo | Mo | Mo | Mo |
| | Source/drain patterning | Channel etch | Channel etch | Channel etch | Channel etch | Channel etch | Channel etch | Channel etch |
| | Protecting film | SiNx | SiNx | SiNx | SiNx | SiNx | SiNx | SiNx |
| | Mobility ($cm^2/Vs$) | 34.4 | 36.3 | 33.2 | 30.1 | 31.2 | 39.1 | 40.9 |
| | Threshold voltage (V) | 0.45 | 0.53 | 0.29 | 1.03 | 0.47 | 0.12 | 0.10 |
| | S-factor (V/dec) | 0.21 | 0.23 | 0.23 | 0.2 | 0.19 | 0.21 | 0.13 |

| | | Example 8 | Example 9 | Example 10 | Example 11 | Example 12 | Example 13 |
|---|---|---|---|---|---|---|---|
| | Composition of target | Ga/(In + Ga) = 0.072 | Ga/(In + Ga) = 0.058 | Ga/(In + Ga) = 0.086 | Al/(In + Al) = 0.013 | Al/(In + Al) = 0.013 | Al/(In + Al) = 0.027 |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 | 0.4 | 0.4 |
| | $[H_2O]/([H_2O] + [Ar] + [O_2])$ (%) | 2 | 2 | 1 | 1 | 1 | 1 |
| | $[Ar]/([H_2O] + [Ar] + [O_2])$ (%) | 95 | 98 | 99 | 99 | 95 | 95 |
| | $[O_2]/([H_2O] + [Ar] + [O_2])$ (%) | 3 | 0 | 0 | 0 | 3 | 3 |
| | Partial pressure of water (Pa) | 8.0E-03 | 8.0E-03 | 4.0E-03 | 4.0E-03 | 4.0E-03 | 4.0E-03 |
| | Sputtering method | DC | DC | DC | DC | DC | DC |
| | T-S distance (mm) | 70 | 70 | 70 | 70 | 70 | 70 |
| | Film thickness (nm) | 50 | 50 | 50 | 50 | 50 | 50 |
| Annealing | Substrate temperature (°C.) | 25 | 25 | 25 | 25 | 25 | 25 |
| | Annealing temperature (°C.) | 300 | 300 | 300 | 300 | 300 | 300 |
| | Annealing time (min) | 60 | 60 | 60 | 60 | 60 | 60 |
| | Atmosphere | Air | Air | Air | Air | Air | Air |
| XRD | Immediately after deposition | Amorphous | Amorphous | Amorphous | Amorphous | Amorphous | Amorphous |
| | After annealing | Crystalline | Crystalline | Crystalline | Crystalline | Crystalline | Crystalline |
| AFM | Rrms (Å) | 2.6 | 1.9 | 2.2 | 1.8 | 2.5 | 1.9 |
| SIM | Average crystal diameter (μm) | 8.9 | 3.7 | 8.2 | 5.2 | 5.1 | 7.6 |
| TEM | Cross-sectional crystal morphology | Columnar crystal | Columnar crystal | Columnar crystal | Columnar crystal | Columnar crystal | Columnar crystal |

TABLE 1-continued

| | | | | | | | |
|---|---|---|---|---|---|---|---|
| Hall measurement | Carrier concentration (cm$^{-3}$) | 1.12E+17 | 1.53E+17 | 1.35E+17 | 6.98E+17 | 3.23E+17 | 1.53E+17 |
| TFT | Channel width/channel length (μm) | 20/10 | 20/10 | 20/10 | 20/10 | 20/10 | 20/10 |
| | Source/drain | Mo | Mo | Mo | Mo | Mo | Mo |
| | Source/drain patterning | Channel etch | Channel etch | Channel etch | Channel etch | Channel etch | Channel etch |
| | Protecting film | SiNx | SiNx | SiNx | SiNx | SiNx | SiNx |
| | Mobility (cm$^2$/Vs) | 38.7 | 36.5 | 38.9 | 36.4 | 38.6 | 34.3 |
| | Threshold voltage (V) | 0.17 | 0.28 | 0.76 | 0.15 | 0.29 | 0.53 |
| | S-factor (V/dec) | 0.18 | 0.15 | 0.27 | 0.2 | 0.18 | 0.22 |

TABLE 2

|  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
|  | Composition of target | $In_2O_3$ | Ga/(In + Ga) = 0.072 | Ga/(In + Ga) = 0.00001 | Ga/(In + Ga) = 0.128 | Al/(In + Al) = 0.013 | Al/(In + Al) = 0.125 | Al/(In + Al) = 0.00001 |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ |
|  | Sputtering pressure (Pa) | 0.4 | 0.4 | 0.4 | 0.4 | 0.4 | 0.4 | 0.4 |
|  | $[H_2O]/([H_2O] + [Ar] + [O_2])$ (%) | 0 | 0 | 0 | 6 | 0 | 6 | 0 |
|  | $[Ar]/([H_2O] + [Ar] + [O_2])$ (%) | 90 | 90 | 90 | 94 | 90 | 94 | 90 |
|  | $[O_2]/([H_2O] + [Ar] + [O_2])$ (%) | 10 | 10 | 10 | 0 | 10 | 0 | 10 |
|  | Partial pressure of water (Pa) | 0 | 0 | 0 | 2.4E−02 | 0 | 2.4E−02 | 0 |
|  | Sputtering method | DC | DC | DC | DC | DC | DC | DC |
|  | T-S distance (mm) | 70 | 70 | 70 | 70 | 70 | 70 | 70 |
|  | Film thickness (nm) | 50 | 50 | 50 | 50 | 50 | 50 | 50 |
|  | Substrate temperature (° C.) | 25 | 25 | 25 | 25 | 25 | 25 | 25 |
| Annealing | Annealing temperature (° C.) | 300 | 300 | 300 | 300 | 300 | 300 | 300 |
|  | Annealing time (min) | 60 | 60 | 60 | 60 | 60 | 60 | 60 |
|  | Atmosphere | Air | Air | Air | Air | Air | Air | Air |
| XRD | Immediately after deposition | Crystalline | Crystalline | Crystalline | Amorphous | Crystalline | Amorphous | Crystalline |
|  | After annealing | Crystalline | Crystalline | Crystalline | Crystalline | Crystalline | Crystalline | Crystalline |
| AFM | Rrms (Å) | 8.6 | 7.3 | 9.2 | 6.4 | 8.8 | 5.9 | 9.6 |
| SIM | Average crystal diameter (μm) | 0.57 | 0.77 | 0.48 | 0.89 | 0.59 | 0.63 | 0.51 |
| TEM | Cross-sectional crystal morphology | Microcrystal | Microcrystal | Microcrystal | Microcrystal | Microcrystal | Microcrystal | Microcrystal |
| Hall measurement | Carrier concentration ($cm^{-3}$) | 1.01E+19 | 5.62E+19 | 8.72E+18 | 5.98E+18 | 6.23E+18 | 8.99E+18 | 3.57E+19 |
| TFT | Channel width/channel length (μm) | 20/10 | 20/10 | 20/10 | 20/10 | 20/10 | 20/10 | 20/10 |
|  | Source/drain | Mo | Mo | Mo | Mo | Mo | Mo | Mo |
|  | Source/drain patterning | Channel etch | Channel etch | Channel etch | Channel etch | Channel etch | Channel etch | Channel etch |
|  | Protecting film | SiNx | SiNx | SiNx | SiNx | SiNx | SiNx | SiNx |
|  | Transfer characteristics | Normally-on | Normally-on | Normally-on | Normally-on | Normally-on | Normally-on | Normally-on |

Example 14

A thin film transistor and a thin film evaluation device were fabricated, and evaluated in the same manner as in Example 1, except that the amorphous film was formed by AC sputtering under the conditions shown in Table 3 using the system disclosed in JP-A-2005-290550, and annealed. The results are shown in Table 3.

AC sputtering was performed using the system illustrated in FIG. 8.

Specifically, six targets 31a to 31f (Zn/(Zn+In)=0.04, width: 200 mm, length: 1700 mm, and thickness: 10 mm) were disposed at an interval of 2 mm in parallel to the widthwise direction of the substrate (not illustrated in FIG. 8). The width of the magnetic field-forming means 40a to 40f was the same as that (200 mm) of the targets 31a to 31f. Ar and $H_2O$ (sputtering gas) were introduced into the system from the gas supply system in a flow rate ratio of 99:1. The pressure of the atmosphere was 0.5 Pa. The power supplied from the alternating power source was set to 3 W/cm$^2$ (=10.2 kW/3400 cm$^2$), and the frequency was set to 10 kHz.

An indium zinc oxide (IZO) film was formed for 10 seconds under the above conditions. The thickness of the IZO film was measured, and found to be 15 nm. The IZO film was formed at a high rate of 90 nm/min (i.e., it is suitable for mass production). The glass substrate provided with the IZO film was put in an electric furnace, annealed at 400° C. for 15 minutes in air, cut to a size of 1 cm$^2$, and subjected to Hall measurement using a four probe method. It was found that the carrier concentration was $1.5 \times 10^{16}$ cm$^{-3}$ (i.e., the film had sufficient semiconductivity).

Examples 15 to 18

A semiconductor thin film was obtained in the same manner as in Example 14, except that the composition of the target and the sputtering conditions were changed as shown in Table 3. A thin film transistor and a thin film evaluation device were fabricated, and evaluated in the same manner as in Example 14. It was found by Hall measurement that a semiconductor was obtained. The results are shown in Table 3.

Comparative Example 8

A film was formed while increasing the output power (alternating current density) to 22 W/cm$^2$. The film was thus formed at a rate of 75 nm/min. However, the crystals were not arranged in a columnar shape with respect to the surface of the sample, and the carrier concentration was $7.5 \times 10^{18}$ cm$^{-3}$ (i.e., a semiconductor was not obtained).

TABLE 3

| | | Example 14 | Example 15 | Example 16 | Example 17 | Example 18 | Comparative Example 8 |
|---|---|---|---|---|---|---|---|
| | Composition of target | Zn/(In + Zn) = 0.04 | Ga/(In + Ga) = 0.072 | $In_2O_3$ | Al/(In + Al) = 0.027 | Ga/(In + Ga) = 0.072 | Al/(In + Al) = 0.027 |
| Sputtering conditions | Ultimate pressure (Pa) | $1.0 \times 10^{-4}$ | $1.0 \times 10^{-4}$ | $1.0 \times 10^{-4}$ | $1.0 \times 10^{-4}$ | $1.0 \times 10^{-4}$ | $1.0 \times 10^{-4}$ |
| | Sputtering pressure (Pa) | 0.5 | 0.3 | 1 | 2 | 4 | 0.2 |
| | $[H_2O]/([H_2O] + [Ar] + [O_2])$ (%) | 1 | 20 | 1 | 4 | 3 | 0 |
| | $[Ar]/([H_2O] + [Ar] + [O_2])$ (%) | 99 | 80 | 99 | 95 | 95 | 30 |
| | $[O_2]/([H_2O] + [Ar] + [O_2])$ (%) | 0 | 0 | 0 | 1 | 2 | 70 |
| | Partial pressure of water (Pa) | 0.005 | 0.06 | 0.01 | 0.08 | 0.12 | 0 |
| | Sputtering method | AC | AC | AC | AC | AC | AC |
| | Alternating current density ($W/cm^2$) | 3 | 20 | 4 | 10 | 6 | 22 |
| | AC frequency (Hz) | 10k | 1M | 20k | 500k | 50k | 10k |
| | Film thickness (nm) | 15 | 55 | 18 | 60 | 40 | 25 |
| | Substrate temperature (° C.) | RT | 70 | RT | 70 | 70 | 70 |
| Annealing | Annealing temperature (° C.) | 400 | 400 | 400 | 400 | 400 | 400 |
| | Annealing time (min) | 15 | 15 | 15 | 15 | 15 | 15 |
| | Atmosphere | Air | Air | Air | Air | Air | Air |
| XRD | Immediately after deposition | Amorphous | Amorphous | Amorphous | Amorphous | Amorphous | Crystalline |
| | After annealing | Crystalline | Crystalline | Crystalline | Crystalline | Crystalline | Crystalline |
| AFM | Rrms (Å) | 2.3 | 1.9 | 2.3 | 2.1 | 2.2 | 8.4 |
| SIM | Average crystal diameter (μm) | 2.5 | 2.5 | 2.5 | 2.5 | 2.5 | 0.34 |
| TEM | Cross-sectional crystal morphology | Columnar crystal | Columnar crystal | Columnar crystal | Columnar crystal | Columnar crystal | Microcrystal |
| Hall measurement | Carrier concentration ($cm^{-3}$) | 1.5E+16 | 6.2E+16 | 3.5E+16 | 2.5E+16 | 3.5E+16 | 7.5E+18 |
| TFT | Channel width/channel length (μm) | 20/10 | 20/10 | 20/10 | 20/10 | 20/10 | 20/10 |
| | Source/drain | Mo | Mo | Mo | Mo | Mo | Mo |
| | Source/drain patterning | Channel etch | Channel etch | Channel etch | Channel etch | Channel etch | Channel etch |
| | Protecting film | SiNx | SiNx | SiNx | SiNx | SiNx | SiNx |
| | Mobility ($cm^2/Vs$) | 24 | 34 | 33 | 31 | 29 | 34 |
| | Threshold voltage (V) | 0.33 | 0.34 | 0.32 | 0.33 | 0.29 | −19.3 |
| | S-factor (V/dec) | 0.29 | 0.22 | 0.26 | 0.3 | 0.29 | 5.4 |

Examples 19 to 27

[1] Fabrication of EBSP Measurement Device, Hall Effect Measurement Device, XRD Evaluation Device, AFM Evaluation Device, and Cross-Sectional TEM Evaluation Device A 4-inch target having the composition shown in Table 4, a conductive silicon substrate provided with a thermal oxide film (thickness: 100 nm), a conductive silicon substrate, and a slide ("#1737" manufactured by Corning) as a substrate were placed in a magnetron sputtering system. An $SiO_x$ film (insulating layer) was formed on the conductive silicon substrate by CVD to a thickness of 100 nm. The insulating layer was then subjected to an ozone treatment, an oxygen plasma treatment, or a nitrogen dioxide plasma treatment (see Table 4).

An amorphous film having a thickness of 50 nm was formed on the conductive silicon substrate provided with a thermal oxide film (thickness: 100 nm), the conductive silicon substrate provided with the $SiO_x$ film (thickness: 100 nm) formed by CVD, and the slide by DC magnetron sputtering under the following conditions. Ar gas, $O_2$ gas, and $H_2O$ gas were introduced when forming the amorphous film in the partial pressure ratio shown in Table 4.

The amorphous film was crystallized using the partial pressure ratio of oxygen, the temperature increase rate, the heat treatment temperature, and the heat treatment time shown in Table 4 to obtain an oxide semiconductor film.

It was confirmed by ICP-AES analysis that the atomic ratio of the elements contained in the crystallized oxide thin film was the same as that of the sputtering target.

The Hall effect measurement device was placed in a "Res-iTest 8300" system (manufactured by Toyo Corporation), and the Hall effect was evaluated at room temperature.

The sputtering conditions are shown below.
Substrate temperature: See Table 4.
Ultimate pressure: $8.5 \times 10^{-5}$ Pa
Atmosphere gas: Ar gas, $O_2$ gas, and $H_2O$ gas (the partial pressure ratio is shown in Table 4)
Sputtering pressure (total pressure): 0.4 Pa
Power supplied: DC 100 W
S-T distance (substrate-target distance): 70 mm

[2] Fabrication of Thin Film Transistor

A conductive silicon substrate provided with a thermal oxide film ($SiO_x$) (thickness: 100 nm), or a conductive silicon substrate provided with an $SiO_x$ film (thickness: 100 nm) formed by CVD, was used as a substrate. The $SiO_x$ film functions as a gate insulating film, and the conductive silicon functions as a gate electrode. The $SiO_x$ film was subjected to an ozone treatment, an oxygen plasma treatment, or a nitrogen dioxide plasma treatment (see Table 4).

An amorphous thin film having a thickness of 50 nm was formed on the gate insulating film by sputtering under the conditions shown in Table 4. A resist ("OFPR #800" manufactured by Tokyo Ohka Kogyo Co., Ltd.) was applied to the amorphous thin film, pre-baked (80° C., 5 minutes), and exposed. The resist was then developed, post-baked (120° C., 5 minutes), and etched using oxalic acid to pattern the resist into the desired shape. The thin film was then annealed using the partial pressure ratio of oxygen, the temperature increase rate, the heat treatment temperature, and the heat treatment time shown in Table 4 to crystallize the thin film.

It was confirmed by ICP-AES analysis that the atomic ratio of the elements contained in the crystallized oxide thin film was the same as that of the sputtering target.

The sputtering conditions are shown below.
Substrate temperature: See Table 4.
Ultimate pressure: $8.5 \times 10^{-5}$ Pa Atmosphere gas: Ar gas, $O_2$ gas, and $H_2O$ gas (the partial pressure ratio is shown in Table 4)
Sputtering pressure (total pressure): 0.4 Pa
Power supplied: 100 W
S-T distance (substrate-target distance): 70 mm An Mo film (200 nm) was then formed by sputtering. Source/drain electrodes having the desired shape were patterned by channel etching. The oxide semiconductor film was subjected to an ozone treatment, an oxygen plasma treatment, or a nitrogen dioxide plasma treatment (see Table 4) as a pretreatment before forming a protecting film.

An $SiN_x$ film (protecting film) was then formed by plasma-enhanced CVD (PECVD). A contact hole was formed using hydrofluoric acid to obtain a thin film transistor.

[3] Measurement of Field-Effect Mobility ($\mu$), S-Factor, and Threshold Voltage (Vth) of Thin Film Transistor The field-effect mobility ($\mu$), the S-factor, and the threshold voltage (Vth) of the thin film transistor were evaluated. The field-effect mobility ($\mu$), the S-factor, and the threshold voltage (Vth) were measured at room temperature in a shading environment (in a shield box) using a semiconductor parameter analyzer ("4200SCS" manufactured by Keithley Instruments Inc.). The drain voltage (Vd) was set to 10 V. The results are shown in Table 4.

[4] Evaluation of Crystal Grain Boundaries Using EBSP

The crystal grain boundaries of the thin film formed on the conductive silicon substrate provided with a thermal oxide film ($SiO_x$) (thickness: 100 nm), or the conductive silicon substrate provided with an $SiO_x$ film (thickness: 100 nm) formed by CVD, were evaluated using an EBSP system ("Hikari High Speed EBSD Detector" and "OIM Analysis Software Ver. 5.2" manufactured by EDAX (TSL)). Electron beams were used at an accelerating voltage of 8 kV.

Figure 9:
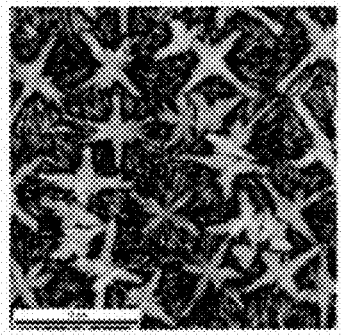
FIG. 9 shows the electron backscattering pattern (EBSP) image quality map of the thin film of Example 19.

FIG. 9 shows the EBSP image quality (IQ) map of the thin film of Example 19. As shown in FIG. 9, a microstructure was observed in the crystal grains. The dimensions of the measurement area were 40×40 μm, and the step size was 0.2 μm.

Figure 10:
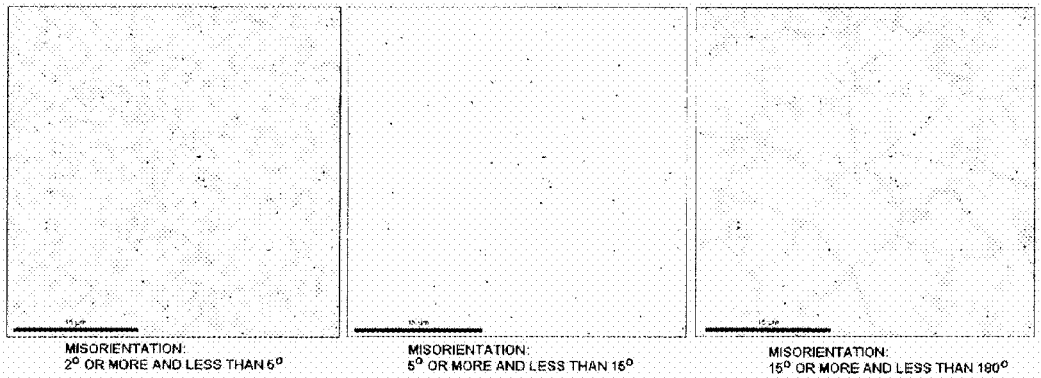
FIG. 10 shows the EBSP misorientation data of the thin film of Example 19.

In order to analyze the microstructure in the crystal grains, EBSP orientation mapping was performed to divide the area into an area having a misorientation of 2° or more and less than 5°, an area having a misorientation of 5° or more and less than 15°, and an area having a misorientation of 15° or more and less than 180°. FIG. 10 shows the misorientation data.

The average crystal diameter was analyzed using an area enclosed by components having a misorientation of 15° or more as a crystal grain, and found to be 10.6 μm. The average crystal diameter measured in Examples 20 to 27 was also 1.0 μm or more.

Grain boundaries having a misorientation of 2° or more and less than 5°, or 5° or more and less than 15°, were mainly observed. The ratio of each grain boundary to the total grain boundaries was calculated. The ratio of grain boundaries having a misorientation of 2° or more and less than 5° was 43.5%, the ratio of grain boundaries having a misorientation of 5° or more and less than 15° was 36.0%, and the ratio of grain boundaries having a misorientation of 15° or more and less than 180° was 20.5%. Therefore, the ratio of grain boundaries having a misorientation of 2° or more and less than 15° to the total grain boundaries was 79.5%.

In Examples 20 to 27, the ratio of grain boundaries having a misorientation of 2° or more and less than 15° to the total grain boundaries was 60 to 90%.

Figure 11:
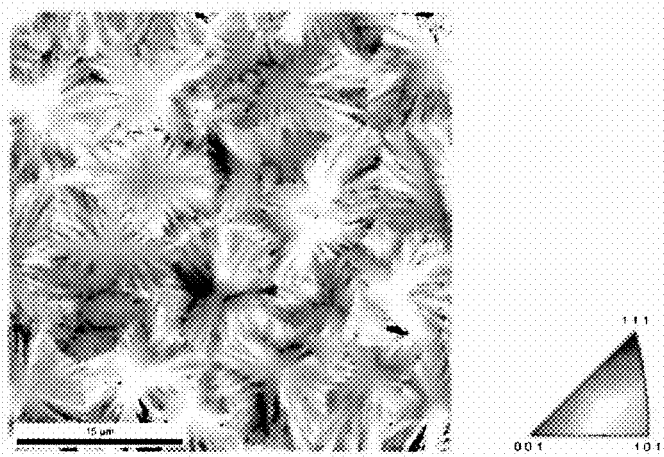
FIG. 11 shows the EBSP orientation map of the thin film of Example 19.

FIG. 11 shows the EBSP orientation map of the thin film of Example 19. The dimensions of the measurement area were 40×40 μm, and the step size was 0.2 μm. The dense crystal grain structure and the crystal orientations ((111), (001), and (101)) were observed corresponding to the grain boundaries having a misorientation of 2° or more and less than 5°, the grain boundaries having a misorientation of 5° or more and less than 15°, and the grain boundaries having a misorientation of 15° or more and less than 180°.

Figure 12:
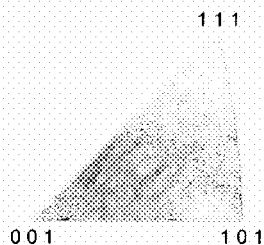
FIG. 12 shows a map in which the measurement points are indicated by dots on the inverse pole figure of Example 19.

FIG. 12 shows a map in which the measurement points are indicated by dots on the inverse pole figure of Example 19. The (111), (001), and (101) orientations were observed in the same manner as in the orientation map.

[5] Evaluation of Crystallinity by XRD

The crystal structure of the thin film of Examples 19 to 27 formed on the glass substrate was determined using an X-ray diffraction measurement system ("Ultima-III" manufactured by Rigaku Corporation).

A diffraction peak was not observed (i.e., the thin film was amorphous) immediately after deposition. A diffraction peak was observed (i.e., the thin film was crystallized) after annealing performed under the conditions shown in Table 4.

As a result of analyzing the X-ray diffraction chart, only an indium oxide bixbyite structure was observed in the crystallized thin films of Examples 19 to 27. The indium oxide bixbyite crystal structure is listed on a JCPDS card. The JCPDS card No. of the indium oxide bixbyite structure is 06-0416.

The XRD measurement conditions are shown below.
System: "Ultima-III" manufactured by Rigaku Corporation
X-rays: Cu-Kα radiation (wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm

[6] Evaluation of Rrms of Oxide Thin Film Using AFM

The Rrms (in a 20×20 μm² area) of the surface of the thin film of Example 19 formed on the glass substrate was measured immediately after deposition using an AFM system ("JSPM-4500" manufactured by JEOL Ltd.), and found to be 1.8 Å (i.e., very flat). Table 4 also shows the Rrms of the thin films of Examples 20 to 27.

[7] Evaluation of Crystal Morphology Using Cross-Sectional TEM

The thin films of Examples 19 to 27 formed on the glass substrate were subjected to cross-sectional TEM measurement. A field emission transmission electron microscope "HF-2100" (manufactured by Hitachi, Ltd.) was used for the measurement. The accelerating voltage was set to 200 kV.

A state in which the crystals were arranged in a columnar shape from the surface of the substrate to the surface of the sample was observed in the same manner as in Examples 1 to 18.

TABLE 4

| | | Example 19 | Example 20 | Example 21 | Example 22 | Example 23 |
|---|---|---|---|---|---|---|
| Sputtering conditions | Composition of target | Ga/(In + Ga) = 0.072 | Ga/(In + Ga) = 0.072 | Ga/(In + Ga) = 0.072 | Ga/(In + Ga) = 0.072 | Ga/(In + Ga) = 0.06 |
| | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 | 0.4 |
| | $[H_2O]/([H_2O] + [Ar] + [O_2])$ (%) | 1 | 2 | 2 | 1 | 2 |
| | $[Ar]/([H_2O] + [Ar] + [O_2])$ (%) | 99 | 98 | 93 | 88 | 95 |
| | $[O_2]/([H_2O] + [Ar] + [O_2])$ (%) | 0 | 0 | 5 | 10 | 3 |
| | Partial pressure of water (Pa) | 4.0E-03 | 8.0E-03 | 8.0E-03 | 4.0E-03 | 8.0E-03 |
| | Sputtering method | DC | DC | DC | DC | DC |
| | T-S distance (mm) | 70 | 70 | 70 | 70 | 70 |
| | Film thickness (nm) | 50 | 50 | 50 | 50 | 50 |
| | Substrate temperature (°C) | 25 | 80 | 25 | 25 | 25 |
| Annealing | Temperature increase rate (°C/s) | 1 | 0.12 | 0.25 | 20 | 0.08 |
| | Annealing temperature (°C) | 300 | 300 | 300 | 300 | 300 |
| | Annealing time (h) | 1 | 2 | 2.5 | 1 | 2 |
| | Partial pressure ratio of oxygen (%) | 50 | 45 | 30 | 30 | 35 |
| | Treatment on thin film evaluation substrate and TFT evaluation substrate | Air Ozone | Nitrogen dioxide plasma | Oxygen plasma | Ozone | Oxygen plasma |
| EBSP | Substrate | SiOx (thermal oxide film)/Si | SiOx (CVD)/Si | SiOx (CVD)/Si | SiOx (CVD)/Si | SiOx (CVD)/Si |
| | Average crystal diameter (μm) | 10.6 | 6.27 | 9.73 | 6.12 | 9.4 |
| | Ratio of grain boundaries having misorientation of 2° or more and less than 15° (%) | 79.5 | 68.9 | 78.5 | 79.8 | 80.3 |
| AFM | Substrate | Glass | Glass | Glass | Glass | Glass |
| | Rrms (Å) | 1.8 | 2.3 | 2.1 | 2.8 | 2.9 |
| TEM | Substrate | Glass | Glass | Glass | Glass | Glass |
| XRD | Cross-sectional crystal morphology | Columnar crystal | Columnar crystal | Columnar crystal | Columnar crystal | Columnar crystal |
| | Substrate | Glass | Glass | Glass | Glass | Glass |
| | Immediately after deposition | Amorphous | Amorphous | Amorphous | Amorphous | Amorphous |
| | After annealing | Crystalline | Crystalline | Crystalline | Crystalline | Crystalline |
| Hall measurement | Substrate | Glass | Glass | Glass | Glass | Glass |
| | Carrier concentration (cm$^{-3}$) | 1.22E+17 | 9.91E+16 | 1.13E+17 | 3.24E+17 | 1.09E+17 |
| TFT | Substrate | SiOx (thermal oxide film)/Si | SiOx (CVD)/Si | SiOx (CVD)/Si | SiOx (CVD)/Si | SiOx (CVD)/Si |
| | Channel layer treatment | Ozone | Nitrogen dioxide plasma | Oxygen plasma | Ozone | Oxygen plasma |
| | Channel width/channel length (μm) | 20/10 | 20/10 | 20/10 | 20/10 | 20/10 |
| | Source/drain | Mo | Mo | Mo | Mo | Mo |
| | Source/drain patterning | Channel etch | Channel etch | Channel etch | Channel etch | Channel etch |
| | Protecting film | SiNx | SiNx | SiNx | SiNx | SiNx |
| | Mobility (cm$^2$/Vs) | 45.3 | 43.4 | 47.9 | 49.1 | 46.5 |
| | Threshold voltage (V) | 0.22 | 0.13 | 0.36 | 0.33 | 0.29 |
| | S-factor (V/dec) | 0.26 | 0.17 | 0.25 | 0.20 | 0.36 |

| | | Example 24 | Example 25 | Example 26 | Example 27 |
|---|---|---|---|---|---|
| Sputtering conditions | Composition of target | Ga/(In + Ga) = 0.05 | Ga/(In + Ga) = 0.05 | Ga/(In + Ga) = 0.08 | Ga/(In + Ga) = 0.08 |
| | Ultimate pressure (Pa) | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 |
| | $[H_2O]/([H_2O] + [Ar] + [O_2])$ (%) | 1 | 1 | 1 | 1 |
| | $[Ar]/([H_2O] + [Ar] + [O_2])$ (%) | 99 | 84 | 99 | 94 |
| | $[O_2]/([H_2O] + [Ar] + [O_2])$ (%) | 0 | 15 | 0 | 5 |

TABLE 4-continued

| | | | | | |
|---|---|---|---|---|---|
| Annealing | Partial pressure of water (Pa) | 4.0E-03 | 4.0E-03 | 4.0E-03 | 4.0E-03 |
| | Sputtering method | DC | DC | DC | DC |
| | T-S distance (mm) | 70 | 70 | 70 | 70 |
| | Film thickness (nm) | 50 | 50 | 50 | 50 |
| | Substrate temperature (° C.) | 25 | 25 | 25 | 25 |
| | Temperature increase rate (° C./s) | 0.12 | 0.12 | 0.12 | 2.5 |
| | Annealing temperature (° C.) | 300 | 300 | 300 | 300 |
| | Annealing time (h) | 2.5 | 1 | 20 | 2.5 |
| | Partial pressure ratio of oxygen (%) | Air | 20 | 20 | Air |
| | Treatment on thin film evaluation substrate and TFT evaluation substrate | Nitrogen dioxide plasma | Nitrogen dioxide plasma | Ozone | Ozone |
| EBSP | Substrate | SiOx (CVD)/Si | SiOx (thermal oxide film)/Si | SiOx (CVD)/Si | SiOx (thermal oxide film)/Si |
| | Average crystal diameter (μm) | 6.59 | 9.95 | 9.92 | 8.75 |
| | Ratio of grain boundaries having misorientation of 2° or more and less than 15° (%) | 78.1 | 76.2 | 79.6 | 76.8 |
| AFM | Substrate | Glass | Glass | Glass | Glass |
| | Rrms (Å) | 1.8 | 2.1 | 1.9 | 2.3 |
| TEM | Substrate | Glass | Glass | Glass | Glass |
| | Cross-sectional crystal morphology | Columnar crystal | Columnar crystal | Columnar crystal | Columnar crystal |
| XRD | Substrate | Glass | Glass | Glass | Glass |
| | Immediately after deposition | Amorphous | Amorphous | Amorphous | Amorphous |
| | After annealing | Crystalline | Crystalline | Crystalline | Crystalline |
| Hall measurement | Substrate | Glass | Glass | Glass | Glass |
| | Carrier concentration (cm⁻³) | 3.46E+17 | 1.20E+17 | 8.70E+16 | 9.10E+16 |
| TFT | Substrate | SiOx (CVD)/Si | SiOx (CVD)/Si | SiOx (CVD)/Si | SiOx (CVD)/Si |
| | Channel layer treatment | Nitrogen dioxide plasma | Nitrogen dioxide plasma | Ozone | Ozone |
| | Channel width/channel length (μm) | 20/10 | 20/10 | 20/10 | 20/10 |
| | Source/drain | Mo | Mo | Mo | Mo |
| | Source/drain patterning | Channel etch | Channel etch | Channel etch | Channel etch |
| | Protecting film | SiNx | SiNx | SiNx | SiNx |
| | Mobility (cm²/Vs) | 41.4 | 46.3 | 39.9 | 41.6 |
| | Threshold voltage (V) | 0.28 | 0.21 | 0.30 | 0.22 |
| | S-factor (V/dec) | 0.20 | 0.19 | 0.27 | 0.24 |

Comparative Examples 9 to 13

[1] Fabrication of Thin Film Transistor and Thin Film Evaluation Device

A thin film transistor and a thin film evaluation device were fabricated, and evaluated in the same manner as in Examples 19 to 27, except that the target used to form the oxide semiconductor film, the sputtering conditions, and the annealing conditions were changed as shown in Table 5, and the oxide semiconductor film was not subjected to the ozone treatment, the oxygen plasma treatment, or the nitrogen dioxide plasma treatment. The results are shown in Table 5.

[2] Evaluation of Crystal Grain Boundaries Using EBSP

The crystal grain boundaries of the thin film formed on the conductive silicon substrate provided with a thermal oxide film (thickness: 100 nm), or the conductive silicon substrate provided with an $SiO_x$ film (thickness: 100 nm) formed by CVD, were evaluated using an EBSP system ("Hikari High Speed EBSD Detector" and "OIM Analysis Software Ver. 5.2" manufactured by EDAX (TSL)). Electron beams were used at an accelerating voltage of 8 kV.

Figure 13:
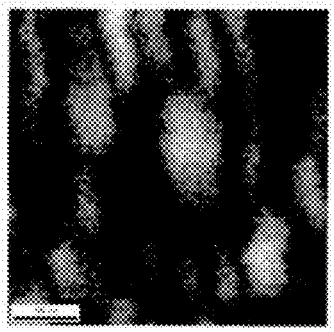
FIG. 13 shows the EBSP image quality map of the thin film of Comparative Example 9.

FIG. 13 shows the EBSP image quality (IQ) map of the thin film of Comparative Example 9. As shown in FIG. 13, a microstructure was not observed in the crystal grains, differing from Examples 19 to 27. Since the crystal grains were small, the dimensions of the measurement area were changed to 0.5×0.5 μm, and the step size was changed to 0.005 μm.

Figure 14:
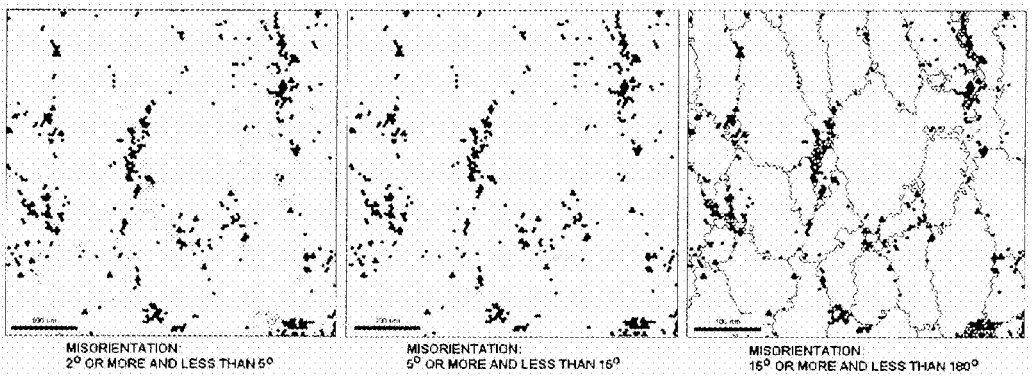
FIG. 14 shows the EBSP misorientation data of the thin film of Comparative Example 9.

In order to analyze the structure of the crystal grains, EBSP orientation mapping was performed to divide the area into an area having a misorientation of 2° or more and less than 5°, an area having a misorientation of 5° or more and less than 15°, and an area having a misorientation of 15° or more and less than 180°. FIG. 14 shows the misorientation data. The average crystal diameter was analyzed using an area enclosed by components having a misorientation of 15° or more as a crystal grain, and found to be 0.137 μm. The average crystal diameter measured in Comparative Examples 10 to 13 was also less than 1.0 μm.

Grain boundaries having a misorientation of 2° or more and less than 5°, or 5° or more and less than 15°, were observed to only a small extent. The ratio of each grain boundary to the total grain boundaries was calculated. The ratio of grain boundaries having a misorientation of 2° or more and less than 5° was 9.6%, the ratio of grain boundaries having a misorientation of 5° or more and less than 15° was 5.4%, and the ratio of grain boundaries having a misorientation of 15° or more and less than 180° was 85%. Therefore, the ratio of grain boundaries having a misorientation of 2° or more and less than 15° the total grain boundaries was 15.0%. In Comparative Examples 10 to 13, the ratio of grain boundaries having a misorientation of 2° or more and less than 15° to the total grain boundaries was less than 60%.

Figure 15:
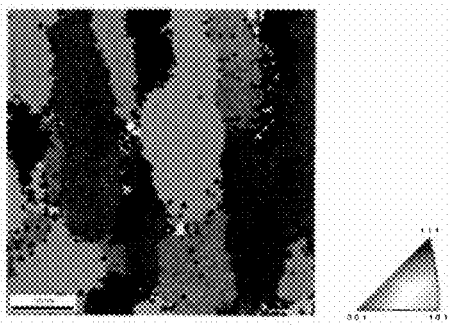
FIG. 15 shows the EBSP orientation map of the thin film of Comparative Example 9.

FIG. 15 shows the EBSP orientation map of the thin film of Comparative Example 9. Since the crystal grains were small, the dimensions of the measurement area were changed to 0.5×0.5 μm, and the step size was changed to 0.005 μm.

Figure 16:
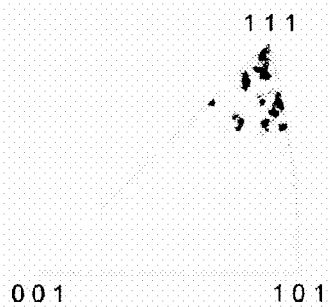
FIG. 16 shows a map in which the measurement points are indicated by dots on the inverse pole figure of Comparative Example 9.

A microstructure was not observed since grain boundaries having a misorientation of 2° or more and less than 5°, or 5° or more and less than 15°, were not observed. The crystal grains showing (111) preferential orientation were observed corresponding to the grain boundaries having a misorientation of 15° or more and less than 180°. FIG. 16 shows a map in which the measurement points are indicated by dots on the inverse pole figure of Comparative Example 9. The (111) preferential orientation was observed in the same manner as in the orientation map.

[3] Evaluation of Crystallinity by XRD

The crystal structure of the thin film formed on the glass substrate was determined in the same manner as in Examples 19 to 27 using an X-ray diffraction measurement system ("Ultima-III" manufactured by Rigaku Corporation). A diffraction peak was observed for the thin films of Comparative Examples 9 to 13 (i.e., the thin film was crystallized) immediately after deposition. The thin film was annealed immediately after deposition under the conditions shown in Table 5.

As a result of analyzing the X-ray diffraction chart, only an indium oxide bixbyite structure was observed in the thin films of Comparative Examples 9 to 13. The indium oxide bixbyite crystal structure is listed on a JCPDS card. The JCPDS card No. of the indium oxide bixbyite structure is 06-0416.

[4] Evaluation of Rrms of Oxide Thin Film Using AFM

The Rrms (in a 20×20 μm² area) of the surface of the thin film of Comparative Example 9 formed on the glass substrate was measured immediately after deposition using an AFM system ("JSPM-4500" manufactured by JEOL Ltd.), and found to be 8.6 Å (i.e., the surface of the thin film of Comparative Example 9 was rough as compared with Examples 19 to 27). Table 5 also shows the Rrms of the thin films of Comparative Examples 10 to 13.

[5] Evaluation of Crystal Morphology Using Cross-Sectional TEM

The thin films of Comparative Examples 9 to 13 formed on the glass substrate were subjected to cross-sectional TEM measurement in the same manner as in Examples 19 to 27. A field emission transmission electron microscope "HF-2100" (manufactured by Hitachi, Ltd.) was used for the measurement. The accelerating voltage was set to 200 kV. The results are shown in Table 5.

[6] Evaluation of Device

The Hall effect measurement device was placed in a "ResiTest 8300" system (manufactured by Toyo Corporation), and the Hall effect was evaluated at room temperature. The results are shown in Table 5. The carrier concentration in the thin films of Comparative Examples 9 to 13 was more than $10^{18}$ $cm^{-3}$. It was thus found that the thin films of Comparative Examples 9 to 13 had a large number of oxygen defects.

The field-effect mobility (μ), the S-factor, and the threshold voltage (Vth) of the thin film transistor were measured at room temperature in a shading environment (in a shield box) using a semiconductor parameter analyzer ("4200SCS" manufactured by Keithley Instruments Inc.). The drain voltage (Vd) was set to 10 V. The results are shown in Table 5. As shown in Table 5, the devices of Comparative Examples 9 to 13 had normally-on properties since the carrier concentration was more than $10^{18}$ $cm^{-3}$.

TABLE 5

|  |  | Comparative Example 9 | Comparative Example 10 | Comparative Example 11 | Comparative Example 12 | Comparative Example 13 |
|---|---|---|---|---|---|---|
|  | Composition of target | Ga/(In + Ga) = 0.072 | Ga/(In + Ga) = 0.01 | Ga/(In + Ga) = 0.015 | Ga/(In + Ga) = 0.005 | Ga/(In + Ga) = 0.005 |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ |
|  | Sputtering pressure (Pa) | 0.4 | 0.4 | 0.4 | 0.4 | 0.4 |

TABLE 5-continued

|  |  | Comparative Example 9 | Comparative Example 10 | Comparative Example 11 | Comparative Example 12 | Comparative Example 13 |
|---|---|---|---|---|---|---|
|  | [H$_2$O]/([H$_2$O] + [Ar] + [O$_2$]) (%) | 0 | 0 | 0 | 0 | 0 |
|  | [Ar]/([H$_2$O] + [Ar] + [O$_2$]) (%) | 90 | 95 | 90 | 90 | 95 |
|  | [O$_2$]/([H$_2$O] + [Ar] + [O$_2$]) (%) | 10 | 5 | 10 | 10 | 5 |
|  | Partial pressure of water (Pa) | 0.0E+00 | 0.0E+00 | 0.0E+00 | 0.0E+00 | 0.0E+00 |
|  | Sputtering method | DC | DC | DC | DC | DC |
|  | T-S distance (mm) | 70 | 70 | 70 | 70 | 70 |
|  | Film thickness (nm) | 50 | 50 | 50 | 50 | 50 |
|  | Substrate temperature (° C.) | 25 | 80 | 25 | 25 | 25 |
| Annealing | Temperature increase rate (° C./s) | 0.6 | 1 | 1 | 1 | 40 |
|  | Annealing temperature (° C.) | 300 | 300 | 400 | 300 | 300 |
|  | Annealing time (h) | 1 | 2 | 1.5 | 1 | 1 |
|  | Partial pressure ratio of oxygen (%) | Air | 15 | Air | 5 | 10 |
| EBSP | Substrate | SiO$x$ (thermal oxide film)/Si | SiO$x$ (CVD)/Si | SiO$x$ (CVD)/Si | SiO$x$ (CVD)/Si | SiO$x$ (CVD)/Si |
|  | Average crystal diameter (μm) | 0.137 | 0.117 | 0.355 | 0.301 | 0.239 |
|  | Ratio of grain boundaries having misorientation of 2° or more and less than 15° (%) | 15.0 | 13.7 | 21.2 | 18.8 | 12.8 |
| AFM | Substrate | Glass | Glass | Glass | Glass | Glass |
|  | Rrms (Å) | 8.6 | 9.1 | 7.3 | 7.1 | 7.6 |
| TEM | Substrate | Glass | Glass | Glass | Glass | Glass |
|  | Cross-sectional crystal morphology | Microcrystal | Microcrystal | Microcrystal | Microcrystal | Microcrystal |
| XRD | Substrate | Glass | Glass | Glass | Glass | Glass |
|  | Immediately after deposition | Crystalline | Crystalline | Crystalline | Crystalline | Crystalline |
|  | After annealing | Crystalline | Crystalline | Crystalline | Crystalline | Crystalline |
| Hall measurement | Substrate | Glass | Glass | Glass | Glass | Glass |
|  | Carrier concentration (cm$^{-3}$) | 8.99E+18 | 9.93E+18 | 7.57E+18 | 6.25E+18 | 9.97E+18 |
| TFT | Substrate | SiO$x$ (thermal oxide film)/Si | SiO$x$ (CVD)/Si | SiO$x$ (CVD)/Si | SiO$x$ (CVD)/Si | SiO$x$ (CVD)/Si |
|  | Channel width/channel length (μm) | 20/10 | 20/10 | 20/10 | 20/10 | 20/10 |
|  | Source/drain | Mo | Mo | Mo | Mo | Mo |
|  | Source/drain patterning | Channel etch | Channel etch | Channel etch | Channel etch | Channel etch |
|  | Protecting film | SiN$x$ | SiN$x$ | SiN$x$ | SiN$x$ | SiN$x$ |
|  | Transfer characteristics | Normally-on | Normally-on | Normally-on | Normally-on | Normally-on |

Examples 28 to 33

[1] Fabrication of KFM Measurement Device, Hall Effect Measurement Device, XRD Evaluation Device, AFM Evaluation Device, and Cross-Sectional TEM Evaluation Device A 4-inch target having the composition shown in Table 6, a conductive silicon substrate provided with a thermal oxide film (thickness: 100 nm), and a slide ("#1737" manufactured by Corning) as a substrate were placed in a magnetron sputtering system.

An amorphous film having a thickness of 50 nm was formed on the silicon substrate provided with a thermal oxide film (thickness: 100 nm) and the slide by DC magnetron sputtering under the following conditions. Ar gas, O$_2$ gas, and H$_2$O gas were introduced when forming the amorphous film in the partial pressure ratio shown in Table 6.

The amorphous film was crystallized using the partial pressure ratio of oxygen, the heat treatment temperature, and the heat treatment time shown in Table 6 to obtain an oxide semiconductor film.

It was confirmed by ICP-AES analysis that the atomic ratio of the elements contained in the crystallized oxide thin film was the same as that of the sputtering target.

The Hall effect measurement device was placed in a "ResiTest 8300" system (manufactured by Toyo Corporation), and the Hall effect was evaluated at room temperature. The results are shown in Table 6.

The sputtering conditions are shown below.
Substrate temperature: See Table 6.
Ultimate pressure: 8.5×10$^{-5}$ Pa
Atmosphere gas: Ar gas, O$_2$ gas, and H$_2$O gas (the partial pressure ratio is shown in Table 6)
Sputtering pressure (total pressure): 0.4 Pa
Power supplied: DC 100 W
S-T distance (substrate-target distance): 70 mm

[2] Fabrication of Thin Film Transistor

A conductive silicon substrate provided with a thermal oxide film (SiO$_x$) (thickness: 100 nm) was used as a substrate. The SiO$_x$ film functions as a gate insulating film, and the conductive silicon functions as a gate electrode.

An amorphous thin film having a thickness of 50 nm was formed on the gate insulating film by sputtering under the conditions shown in Table 6. A resist ("OFPR #800" manufactured by Tokyo Ohka Kogyo Co., Ltd.) was applied to the amorphous thin film, pre-baked (80° C., 5 minutes), and exposed. The resist was then developed, post-baked (120° C., 5 minutes), and etched using oxalic acid to pattern the resist into the desired shape. The thin film was then annealed using the partial pressure ratio of oxygen, the heat treatment temperature, and the heat treatment time shown in Table 6 to crystallize the thin film.

It was confirmed by ICP-AES analysis that the atomic ratio of the elements contained in the crystallized oxide thin film was the same as that of the sputtering target.

Figure 17:
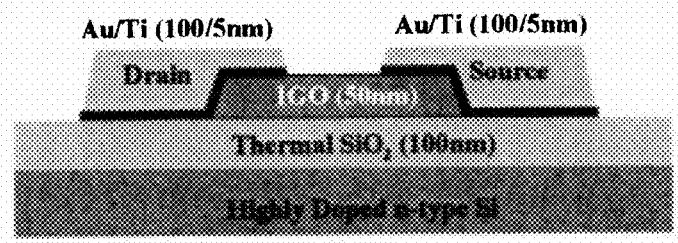
FIG. 17 is a view illustrating the shape of the thin film transistors fabricated in Examples 28 to 33.

The sputtering conditions are shown below.
Substrate temperature: See Table 6.
Ultimate pressure: 8.5×10$^{-5}$ Pa
Atmosphere gas: Ar gas, O$_2$ gas, and H$_2$O gas (the partial pressure ratio is shown in Table 6)
Sputtering pressure (total pressure): 0.4 Pa
Power supplied: 100 W
S-T distance (substrate-target distance): 70 mm An Au film (thickness: 100 nm) and a Ti film (thickness: 5 nm) were then formed by sputtering. Source/drain electrodes having the desired shape were patterned by a lift-off process.
FIG. 17 illustrates the shape of the device.

Figure 18:
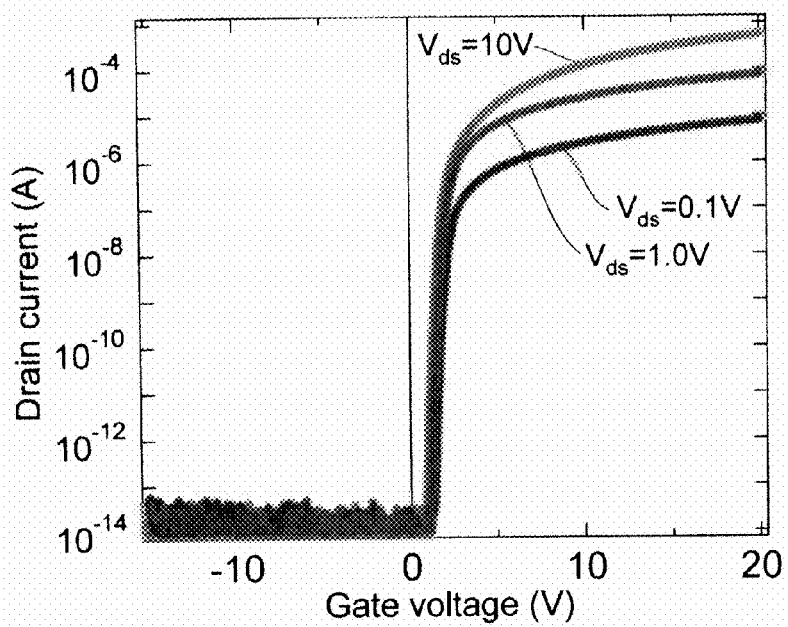
FIG. 18 is a graph showing the transfer characteristics of the thin film transistor fabricated in Example 28.

[3] Measurement of Field-Effect Mobility (μ), S-Factor, and Threshold Voltage (Vth) of Thin Film Transistor The field-effect mobility (μ), the S-factor, and the threshold voltage (Vth) of the thin film transistor were evaluated. The field-effect mobility (μ), the S-factor, and the threshold voltage (Vth) were measured at room temperature in a shading environment (in a shield box) using a semiconductor parameter analyzer ("4200SCS" manufactured by Keithley Instruments Inc.). FIG. 18 shows the transfer characteristics of the thin film transistor of Example 28 (drain voltage: 0.1, 1.0, or 10 V). The field-effect mobility, the S-factor, and the threshold voltage of the thin film transistor (drain voltage: 10 V) were evaluated. In Examples 29 to 33, the field-effect mobility, the S-factor, and the threshold voltage were evaluated at a drain voltage of 10V. The results are shown in Table 6.

[4] Evaluation of Crystallinity by X-Ray Diffraction (XRD) Measurement

Figure 19:
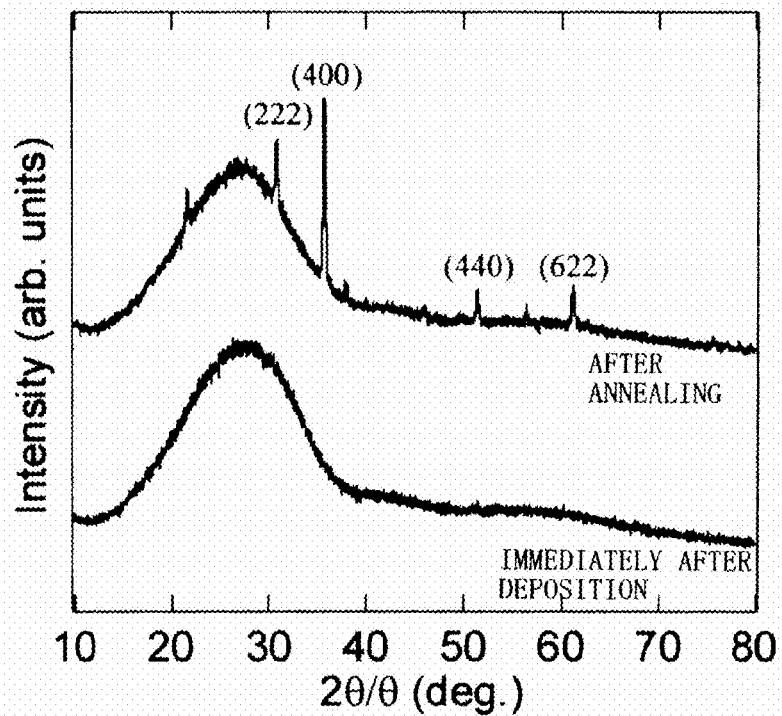
FIG. 19 shows the X-ray diffraction chart of the thin film of Example 28 (immediately after deposition and after annealing).

The crystal structure of the thin film formed on the glass substrate was determined using an X-ray diffraction measurement system ("Ultima-III" manufactured by Rigaku Corporation). FIG. 19 shows the X-ray diffraction chart of the thin film of Example 28 immediately after deposition and after annealing.

A diffraction peak was not observed (i.e., the thin film was amorphous) immediately after deposition. A diffraction peak was observed (i.e., the thin film was crystallized) after annealing. FIG. 19 shows the X-ray diffraction chart of the thin film of Example 28 after annealing.

As a result of analyzing the X-ray diffraction chart, only an indium oxide bixbyite structure was observed in the crystallized thin film of Example 28. The indium oxide bixbyite crystal structure is listed on a Joint Committee of Powder Diffraction Standards (JCPDS) card. The JCPDS card No. of the indium oxide bixbyite structure is 06-0416.

The thin films of Examples 29 to 33 were amorphous immediately after deposition in the same manner as the thin film of Example 28, and only an indium oxide bixbyite structure was observed after annealing.

The XRD measurement conditions are shown below.
System: "SmartLab" manufactured by Rigaku Corporation
X-rays: Cu-Kα radiation (wavelength: 1.5406 Å, monochromatized using a graphite monochromator)
2θ-θ reflection method, continuous scan (1.0°/min)
Sampling interval: 0.02°
Slit DS, SS: 2/3°, RS: 0.6 mm

[5] Evaluation of Rrms (Root-Mean-Square-Roughness) of Oxide Thin Film Using Atomic Force Microscope (AFM)

The Rrms (in a 20×20 μm² area) of the surface of the thin film of Example 28 formed on the glass substrate was measured immediately after deposition using an AFM system ("JSPM-4500" manufactured by JEOL Ltd.), and found to be 1.8 Å (i.e., very flat). The Rrms of the thin films of Examples 29 to 33 was measured in the same manner as described above. The results are shown in Table 6.

[6] Evaluation of Crystal Diameter Using Scanning Ion Microscopy (SIM)

The thin film of Example 28 formed on the glass substrate was subjected to SIM measurement. A focused ion beam system "FB-2100" (manufactured by Hitachi, Ltd.) was used for the measurement. The accelerating voltage was set to 40 kV.

The average crystal diameter determined by analyzing the thin film of Example 28 after annealing (crystallization) was 9.3 μm.

The average crystal diameter of the oxide semiconductor thin film was determined by measuring the maximum diameter of each crystal grain observed within a 35×35-μm square area, and calculating the average value of the maximum diameters. The average crystal diameter of the thin films of Examples 29 to 33 was measured in the same manner as described above. The results are shown in Table 6.

[7] Evaluation of Crystal Morphology Using Cross-Sectional Transmission Electron Microscope (TEM)

The thin film of Example 28 formed on the glass substrate was subjected to cross-sectional TEM measurement. A field emission transmission electron microscope "HF-2100" (manufactured by Hitachi, Ltd.) was used for the measurement. The accelerating voltage was set to 200 kV.

Figure 20:
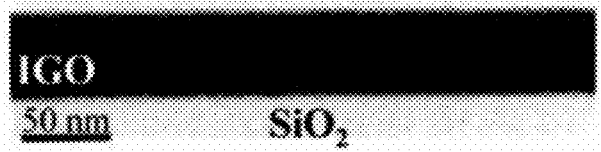
FIG. 20 shows the TEM image of the cross section of the thin film of Example 28 (immediately after deposition and after annealing).
Figure 20:
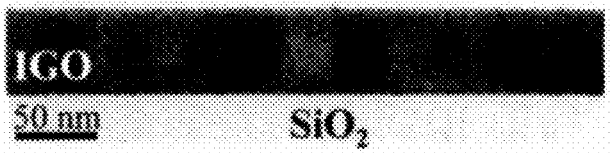

FIG. 20 shows the cross-sectional TEM image of the thin film of Example 28 immediately after deposition and after annealing (crystallization). Note that FIG. 20 is a partial enlarged view of the oxide thin film within a 1×1-μm square field of view at a magnification of 50,000.

As shown in FIG. 20, the thin film of Example 28 immediately after deposition was amorphous.

A state in which the crystals were arranged in a columnar shape from the surface of the substrate to the surface of the sample was observed after annealing (crystallization).

In Examples 29 to 33, a state in which the crystals were arranged in a columnar shape from the surface of the substrate to the surface of the sample was also observed after annealing (crystallization).

[8] Evaluation of Potential Barrier Using Kelvin Probe Force Microscopy (KFM)

The thin film of Example 28 formed on the silicon substrate provided with a thermal oxide film was subjected to KFM measurement. An E-sweep environmental control unit/NanoNavi probe station was used for the measurement. The dimensions of the measurement area were 25×25 μm, and the measurement was performed at room temperature.

Figure 21:
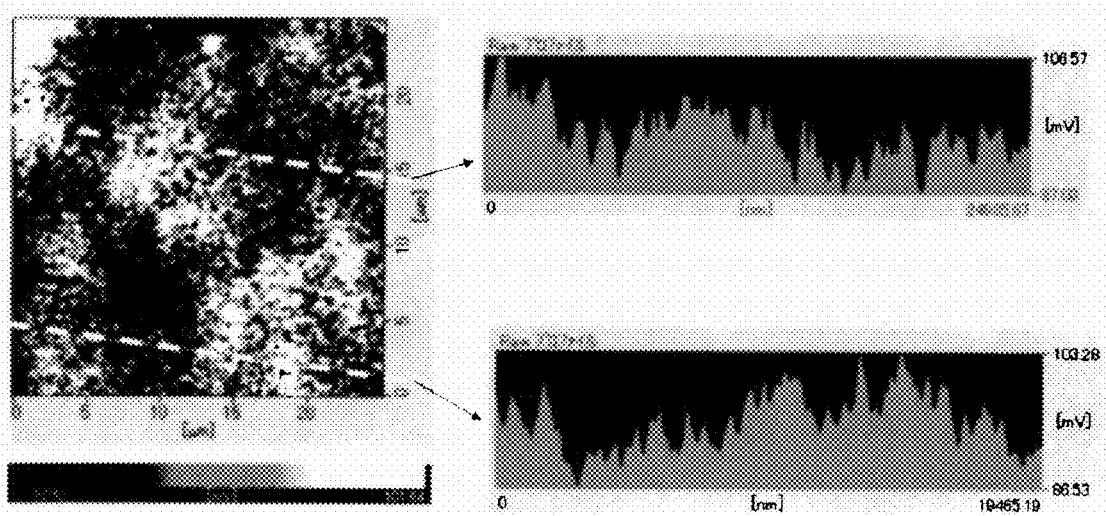
FIG. 21 is a view showing the surface potential profile of the crystallized thin film of Example 28.

FIG. 21 shows the surface potential profile of the thin film of Example 28 after annealing (crystallization). As shown in FIG. 21, the potential difference between the maximum value and the minimum value of the surface potential of the thin film of Example 28 was 19.54 mV (i.e., 30 mV or less). The thin films of Examples 29 to 33 were also subjected to the KFM measurement in the same manner as described above. The potential difference between the maximum value and the minimum value of the surface potential of the thin films of Examples 29 to 33 in the 25×25-μm measurement area was 30 mV or less. The results are shown in Table 6.

TABLE 6

|  |  | Example 28 | Example 29 | Example 30 | Example 31 | Example 32 | Example 33 |
|---|---|---|---|---|---|---|---|
|  | Composition of target | Ga/(In + Ga) = 0.072 | Ga/(In + Ga) = 0.01 | Ga/(In + Ga) = 0.02 | Ga/(In + Ga) = 0.09 | $In_2O_3$ | Al/(In + Al) = 0.013 |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ | $8.5 \times 10^{-5}$ |
|  | Sputtering pressure (Pa) | 0.4 | 0.4 | 0.4 | 0.4 | 0.4 | 0.4 |
|  | [$H_2O$]/([$H_2O$] + [Ar] + [$O_2$]) (%) | 1 | 2 | 2 | 1 | 2 | 1 |
|  | [Ar]/([$H_2O$] + [Ar] + [$O_2$]) (%) | 94 | 96 | 98 | 99 | 95 | 97 |
|  | [$O_2$]/([$H_2O$] + [Ar] + [$O_2$]) (%) | 5 | 2 | 0 | 0 | 3 | 2 |

TABLE 6-continued

|  |  | Example 28 | Example 29 | Example 30 | Example 31 | Example 32 | Example 33 |
|---|---|---|---|---|---|---|---|
|  | Partial pressure of water (Pa) | $4.0 \times 10^{-3}$ | $8.0 \times 10^{-3}$ | $8.0 \times 10^{-3}$ | $4.0 \times 10^{-3}$ | $8.0 \times 10^{-3}$ | $4.0 \times 10^{-3}$ |
|  | Sputtering method | DC | DC | DC | DC | DC | DC |
|  | T-S distance (mm) | 70 | 70 | 70 | 70 | 70 | 70 |
|  | Film thickness (nm) | 50 | 50 | 50 | 50 | 50 | 50 |
|  | Substrate temperature (° C.) | 25 | 25 | 25 | 25 | 25 | 25 |
| Annealing | Annealing temperature (° C.) | 300 | 300 | 300 | 300 | 300 | 300 |
|  | Annealing time (min) | 60 | 60 | 60 | 60 | 60 | 60 |
|  | Atmosphere | Air | Air | Air | Air | Air | Air |
| XRD | Immediately after deposition | Amorphous | Amorphous | Amorphous | Amorphous | Amorphous | Amorphous |
|  | After annealing | Crystalline | Crystalline | Crystalline | Crystalline | Crystalline | Crystalline |
| AFM | Rrms (Å) | 1.8 | 2.1 | 1.9 | 1.9 | 2.0 | 2.1 |
| SIM | Average crystal diameter (μm) | 9.3 | 8.3 | 6.5 | 8.1 | 8.6 | 8.9 |
| TEM | Cross-sectional crystal morphology | Columnar crystal | Columnar crystal | Columnar crystal | Columnar crystal | Columnar crystal | Columnar crystal |
| KFM | Surface potential difference (mV) | 19.54 | 18.29 | 19.78 | 16.03 | 21.32 | 18.83 |
| Hall measurement | Carrier concentration (cm$^{-3}$) | $1.28 \times 10^{17}$ | $1.37 \times 10^{17}$ | $1.25 \times 10^{17}$ | $1.41 \times 10^{17}$ | $8.72 \times 10^{17}$ | $3.39 \times 10^{17}$ |
| TFT | Channel width/channel length (μm) | 20/5 | 20/5 | 20/5 | 20/5 | 20/5 | 20/5 |
|  | Source/drain | Au/Ti | Au/Ti | Au/Ti | Au/Ti | Au/Ti | Au/Ti |
|  | Source/drain patterning | Lift-off | Lift-off | Lift-off | Lift-off | Lift-off | Lift-off |
|  | Mobility (cm$^2$/Vs) | 39.1 | 40.1 | 39.4 | 35.8 | 40.2 | 36.7 |
|  | Threshold voltage (V) | 1.4 | 0.88 | 0.27 | 0.27 | 1.2 | 0.03 |
|  | S-factor (V/dec) | 0.12 | 0.23 | 0.19 | 0.15 | 0.21 | 0.28 |

INDUSTRIAL APPLICABILITY

When the oxide layer and the insulating layer included in the stacked layer structure according to the invention are respectively used as the channel layer and the gate insulating film of a thin film transistor, a protecting film can be formed directly on the channel layer without providing a buffer layer. Therefore, the stacked layer structure according to the invention is useful for producing a thin film transistor.

The thin film transistor according to the invention may suitably be used for a display apparatus (particularly a large-area display).

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The documents described in the specification are incorporated herein by reference in their entirety.

The invention claimed is:

1. A stacked layer structure comprising an oxide layer and an insulating layer,
the oxide layer having a carrier concentration of greater than $10^{13}/cm^3$ to $10^{18}/cm^3$ and an average crystal diameter of 1 μm to less than 27 μm; and
the crystals of the oxide layer being arranged in a columnar shape on the surface of the insulating layer.

2. The stacked layer structure according to claim 1, wherein a material which the oxide layer comprises is selected from indium oxide, Ga-doped indium oxide, Al-doped indium oxide, Zn-doped indium oxide and Sn-doped indium oxide.

3. The stacked layer structure according to claim 2, wherein the Ga-doped indium oxide has an atomic ratio Ga/(Ga+In) of 0.01 to 0.09.

4. The stacked layer structure according to claim 2, wherein the Al-doped indium oxide has an atomic ratio Al/(Al+In) of 0.01 to 0.05.

5. A thin film transistor comprising:
the oxide layer and the insulating layer in the stacked layer structure according to claim 1 as a channel layer and a gate insulating film respectively; and
a protecting film which comprises SiNx being provided on the oxide layer.

6. A display apparatus comprising the thin film transistor according to claim 5.

* * * * *